US011664075B2

(12) United States Patent
Lien et al.

(10) Patent No.: US 11,664,075 B2
(45) Date of Patent: May 30, 2023

(54) SUB-BLOCK PROGRAMMING MODE WITH MULTI-TIER BLOCK

(71) Applicant: SanDisk Technologies LLC, Addison, TX (US)

(72) Inventors: Yu-Chung Lien, San Jose, CA (US); Jiahui Yuan, Fremont, CA (US); Tomer Eliash, Sunnyvale, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 17/461,922

(22) Filed: Aug. 30, 2021

(65) Prior Publication Data

US 2023/0069260 A1 Mar. 2, 2023

(51) Int. Cl.
| | |
|---|---|
| *G11C 16/10* | (2006.01) |
| *G11C 16/16* | (2006.01) |
| *G11C 16/04* | (2006.01) |
| *G11C 16/08* | (2006.01) |
| *G11C 16/26* | (2006.01) |

(52) U.S. Cl.
CPC ........ *G11C 16/102* (2013.01); *G11C 16/0433* (2013.01); *G11C 16/08* (2013.01); *G11C 16/16* (2013.01); *G11C 16/26* (2013.01)

(58) Field of Classification Search
CPC ... G11C 16/102; G11C 16/0433; G11C 16/08; G11C 16/16; G11C 16/26
See application file for complete search history.

(56) References Cited

U.S. PATENT DOCUMENTS

| | | | |
|---|---|---|---|
| 8,230,165 B2 | 7/2012 | Han | |
| 8,861,267 B2 | 10/2014 | Seol et al. | |
| 9,583,201 B1 | 2/2017 | Lee | |
| 9,620,201 B1 | 4/2017 | Lai et al. | |
| 9,728,262 B2 * | 8/2017 | Baran | G11C 16/24 |
| 9,881,929 B1 | 1/2018 | Ravikirthi et al. | |
| 10,665,299 B1 * | 5/2020 | Lu | G11C 16/0483 |
| 10,741,253 B1 * | 8/2020 | Lu | G11C 16/16 |

(Continued)

FOREIGN PATENT DOCUMENTS

WO  WO2020/146056 A1  7/2020

OTHER PUBLICATIONS

International Search Report & the Written Opinion of the International Searching Authority dated Sep. 7, 2022.

*Primary Examiner* — Kretelia Graham
(74) *Attorney, Agent, or Firm* — Vierra Magen Marcus LLP

(57) ABSTRACT

Apparatuses and techniques are described for programming a multi-tier block in which sub-blocks are arranged in respective tiers. When a program operation involves the source-side sub-block, the NAND strings are pre-charged from the source line. When a program operation involves the drain-side sub-block, the NAND strings are pre-charged from the bit line. When a program operation involves an interior sub-block, the NAND strings can be pre-charged from the bit line if all sub-blocks on the drain side of the interior sub-block are erased, or from the source line if all sub-blocks on the source side of the interior sub-block are erased. A table can be provided which identifies free blocks, free sub-blocks and a corresponding program order. If such a table is not available, the sub-blocks can be read to determine whether they are programmed.

19 Claims, 26 Drawing Sheets

(56) References Cited

U.S. PATENT DOCUMENTS

| | | |
|---|---|---|
| 10,748,627 B2 * | 8/2020 | Chen .................. G11C 16/3427 |
| 10,770,157 B1 | 9/2020 | Chen et al. |
| 11,018,152 B2 | 5/2021 | Hinoue et al. |
| 2003/0002317 A1 | 1/2003 | Hee et al. |
| 2007/0285980 A1 | 12/2007 | Shimizu et al. |
| 2016/0064083 A1 * | 3/2016 | Nam .................. G11C 16/0483 365/185.11 |
| 2017/0256308 A1 | 9/2017 | Kang |
| 2020/0211663 A1 * | 7/2020 | Baraskar ............ G11C 16/3459 |
| 2021/0158871 A1 * | 5/2021 | Shin ...................... G06F 3/0659 |

* cited by examiner

Fig. 1A (Prior Art)
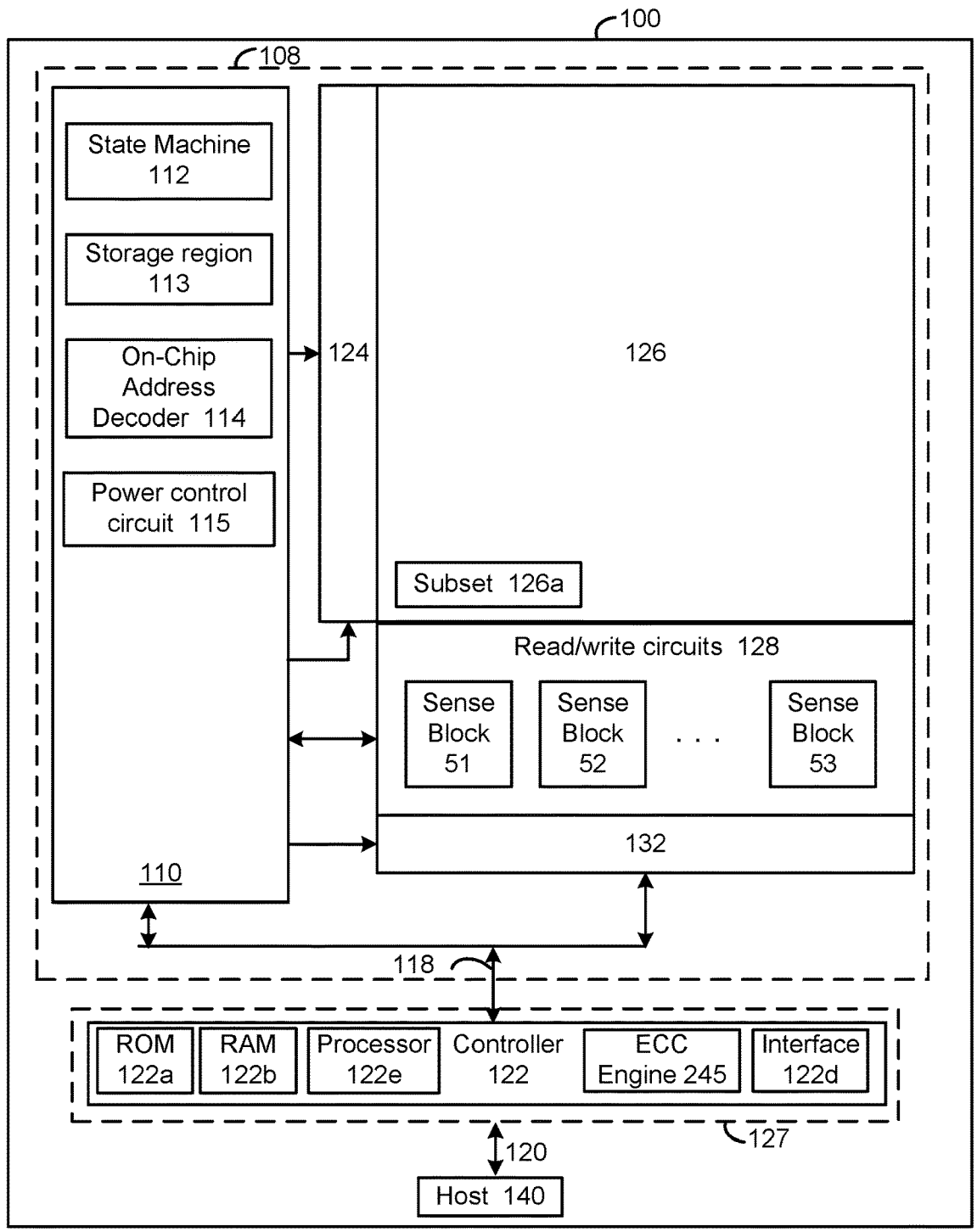
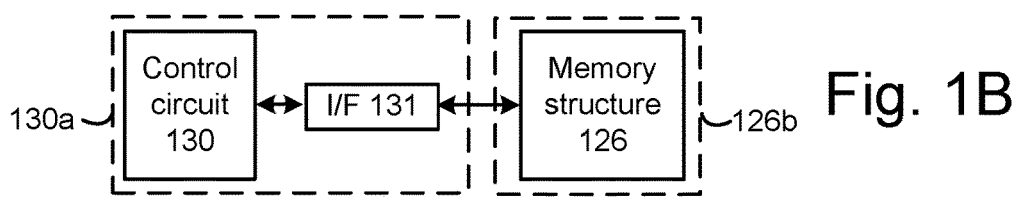
Fig. 1B

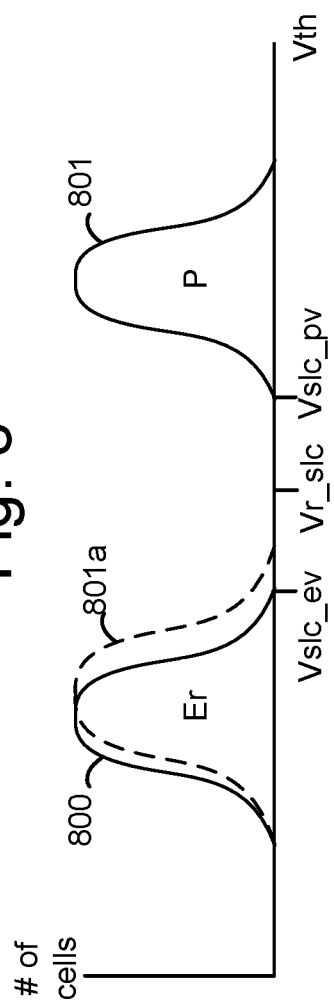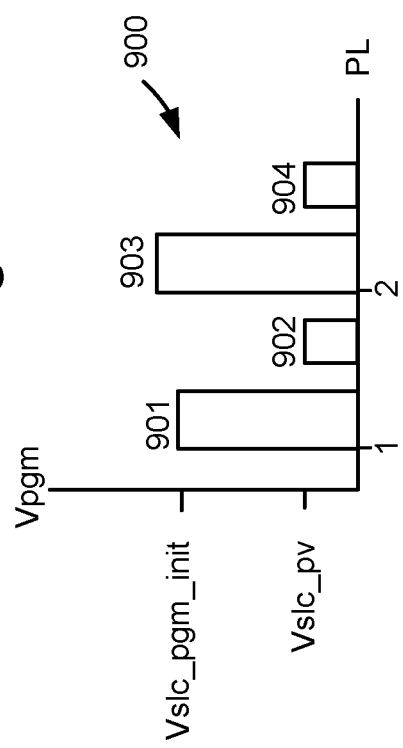

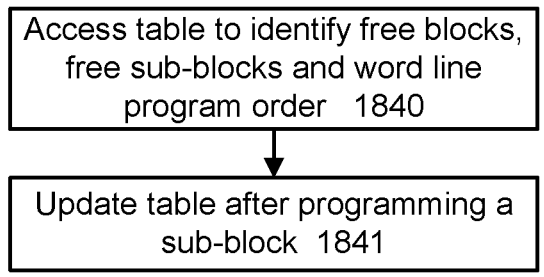
Fig. 18D
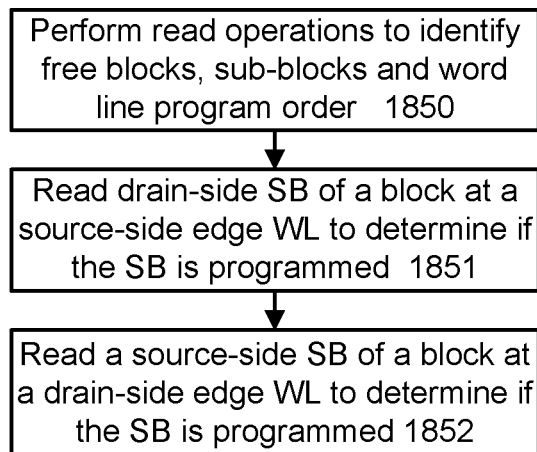
Fig. 18E
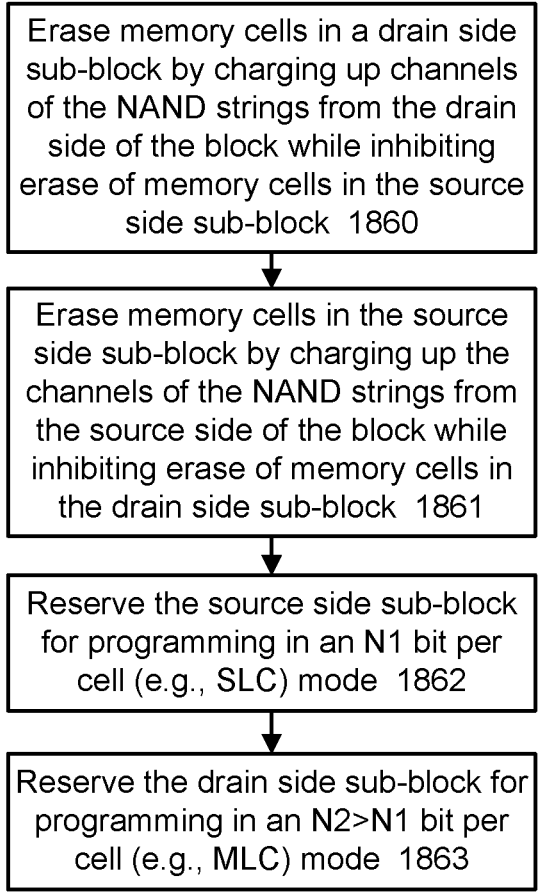
Fig. 18F
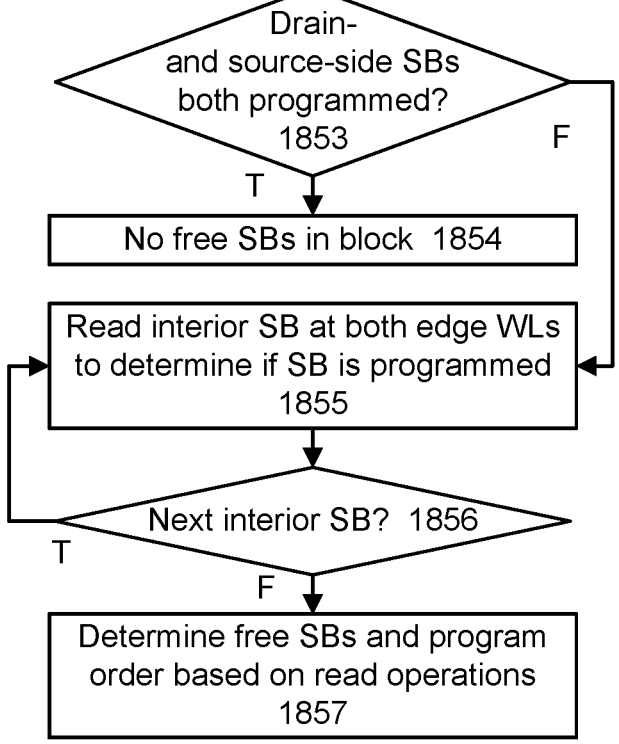

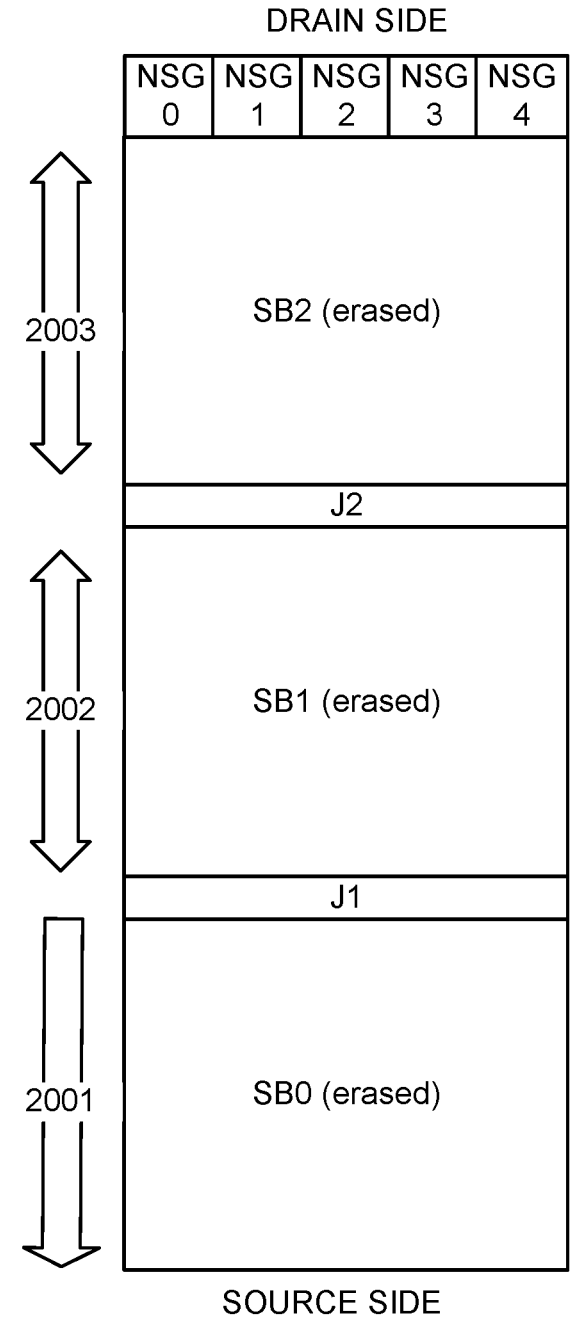

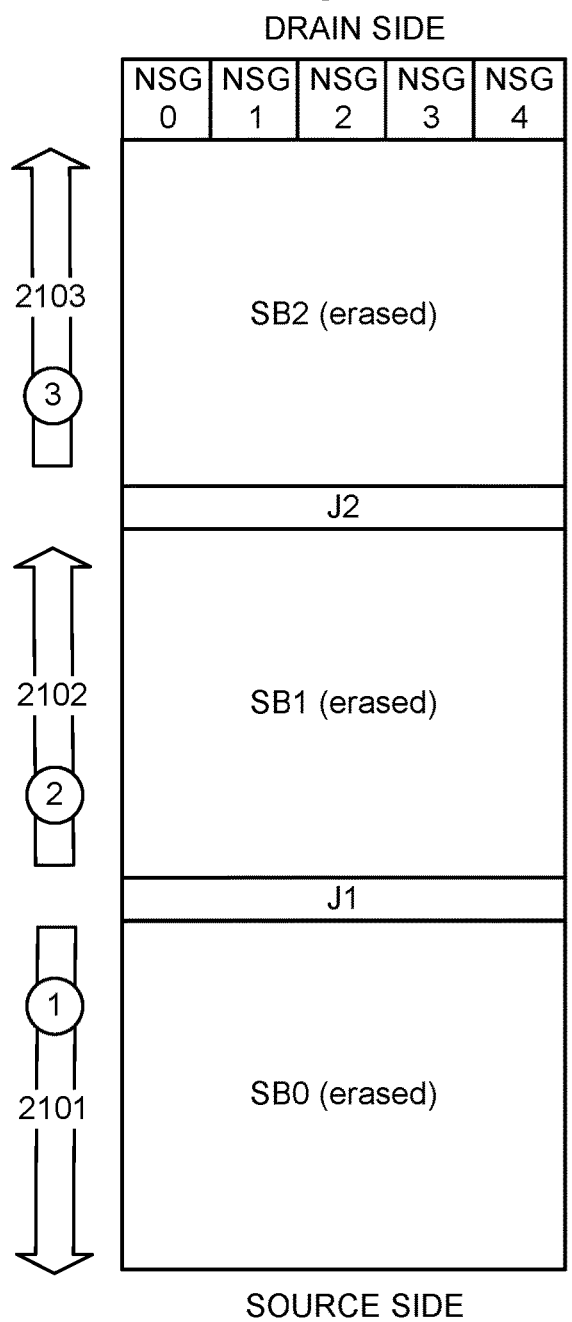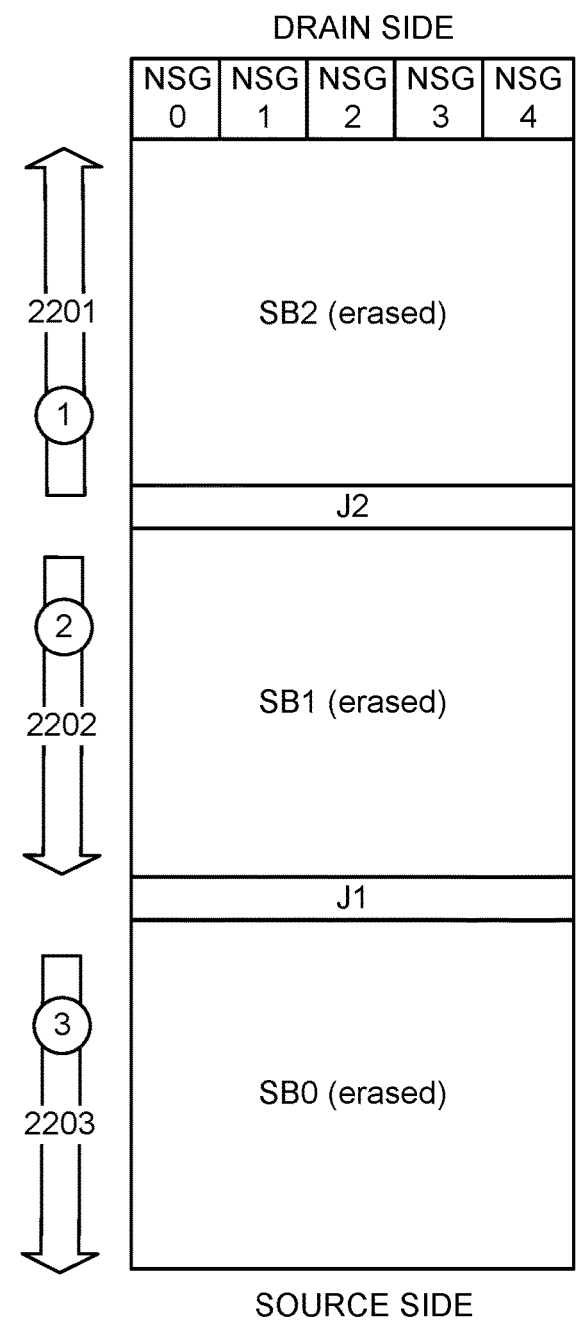

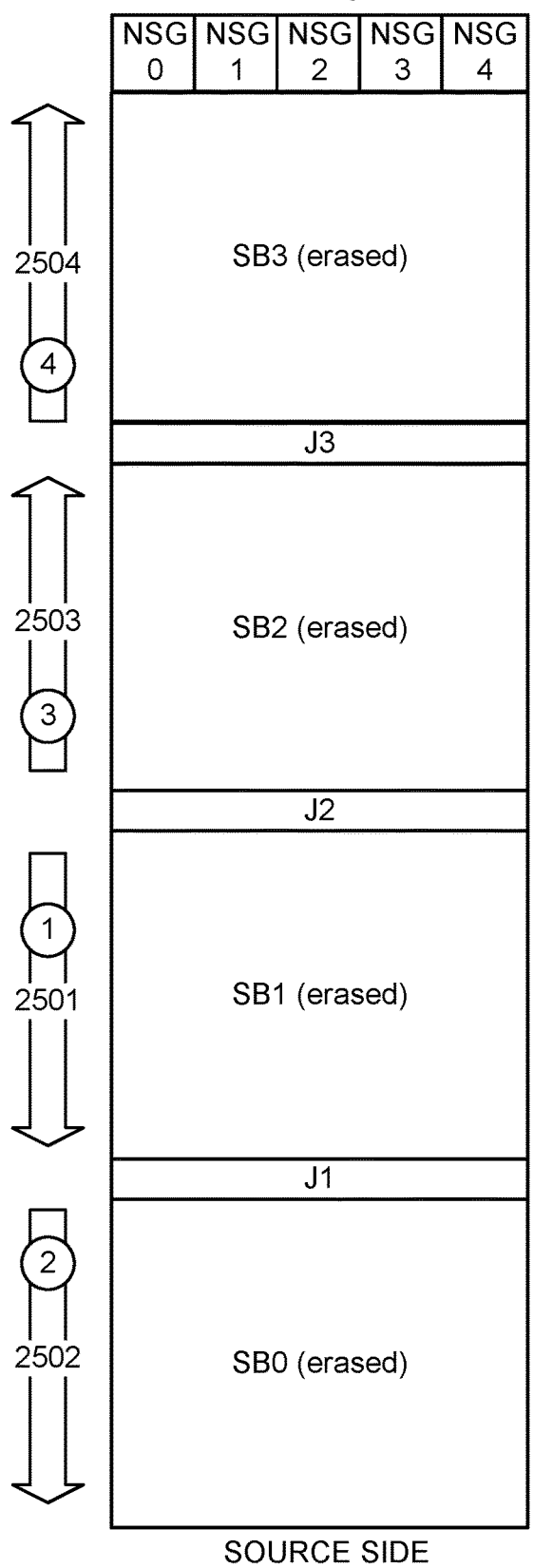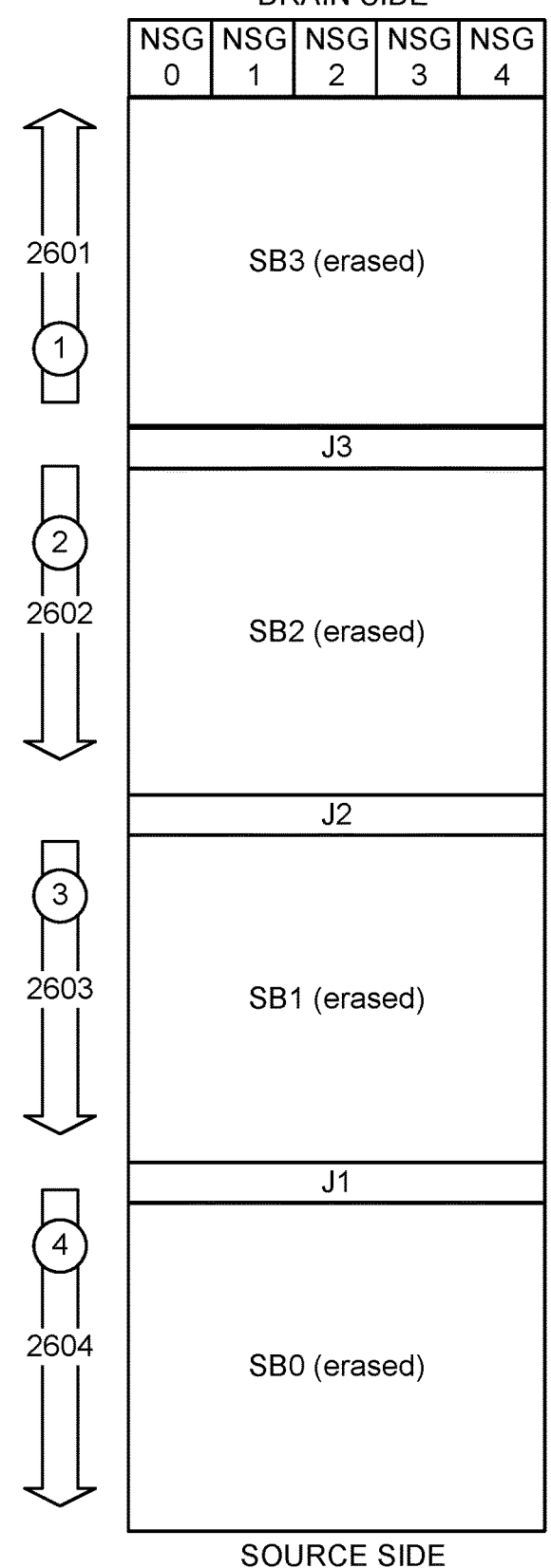

Fig. 28
Fig. 29
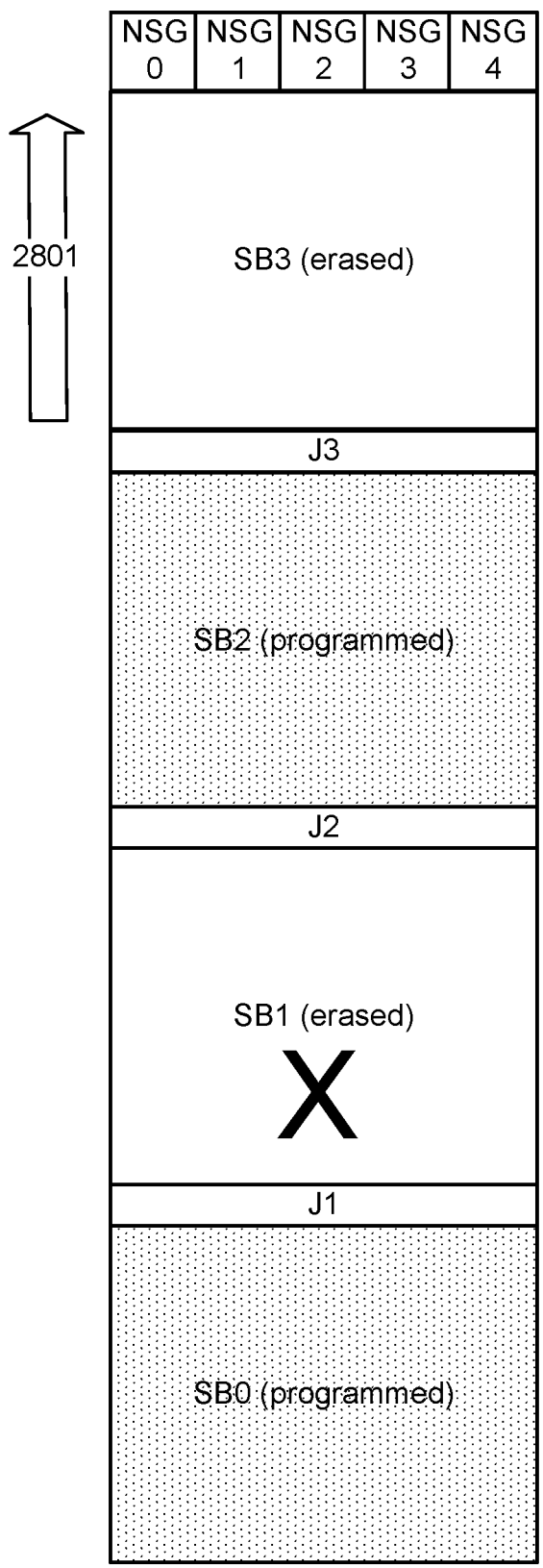
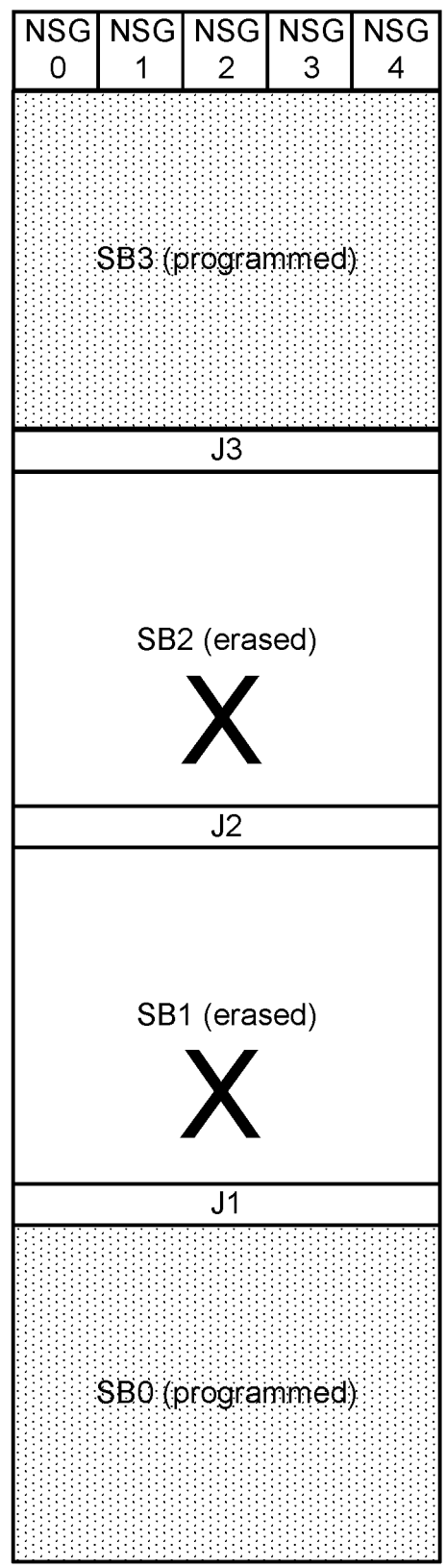

| Free blocks: | Free SBs: | WL pgm. direction | Next SB to pgm.: |
|---|---|---|---|
| B0-0 | SB0 | Source | SB1 |
| | SB1 | Drain | SB2 |
| | SB2 | Drain | SB3 |
| | SB3 | Drain | |

Fig. 30A

| Free blocks: | Free SBs: | WL pgm. direction: | Next SB to pgm.: |
|---|---|---|---|
| B0-0 | SB1 | Drain | SB2 |
| | SB2 | Drain | SB3 |
| | SB3 | Drain | |

Fig. 30B

| Free blocks: | Free SBs: | WL pgm. direction: | Next SB to pgm.: |
|---|---|---|---|
| B0-0 | SB2 | Drain | SB3 |
| | SB3 | Drain | |

Fig. 30C

| Free blocks: | Free SBs: | WL pgm. direction: | Next SB to pgm.: |
|---|---|---|---|
| B0-0 | SB3 | Drain | |

Fig. 30D

| Free blocks: | Free SBs: | WL pgm. direction: | Next SB to pgm.: |
|---|---|---|---|
| B0-0 | SB1 | Source | SB0 |
| | SB0 | Source | SB2 |
| | SB2 | Drain | SB3 |
| | SB3 | Drain | |

Fig. 31A

| Free blocks: | Free SBs: | WL pgm. direction: | Next SB to pgm.: |
|---|---|---|---|
| B0-0 | SB0 | Source | SB2 |
| | SB2 | Drain | SB3 |
| | SB3 | Drain | |

Fig. 31B

| Free blocks: | Free SBs: | WL pgm. direction: | Next SB to pgm.: |
|---|---|---|---|
| B0-0 | SB2 | Drain | SB3 |
| | SB3 | Drain | |

Fig. 31C

| Free blocks: | Free SBs: | WL pgm. direction: | Next SB to pgm.: |
|---|---|---|---|
| B0-0 | SB3 | Drain | |

Fig. 31D

SUB-BLOCK PROGRAMMING MODE WITH MULTI-TIER BLOCK

BACKGROUND

The present technology relates to the operation of memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A memory device includes memory cells which may be arranged in series, in NAND strings, for instance, where select gate transistors are provided at the ends of a NAND string to selectively connect a channel of the NAND string to a source line or bit line. However, various challenges are presented in operating such memory devices.

BRIEF DESCRIPTION OF THE DRAWINGS

FIG. 1A is a block diagram of an example memory device.

FIG. 1B is a block diagram of an arrangement of the memory device 100 of FIG. 1A in which a control circuit 130 on a first die 130a communicates with the memory structure 126 on a separate second die 126b.

FIG. 8 depicts a Vth distribution for a set of SLC memory cells.

FIG. 9 depicts an example voltage signal 900 applied to a selected word line in an SLC program operation, consistent with FIG. 8.

FIG. 18D depicts a flowchart of a process for accessing a table to identify a free block, free sub-blocks and a word line program order, consistent with FIG. 18A.

FIG. 18E depicts a flowchart of a process for reading edges word lines of sub-blocks of a block to identify their program or erased status and to determine a programmable sub-block and a word line program order, consistent with FIG. 18A.

FIG. 18F depicts a flowchart of a process for erasing sub-blocks of memory cells, reserving a source-side sub-block for programming in an N1 bit per cell mode and reserving a drain-side sub-block for programming in an N2>N1 bit per cell mode.

FIG. 19 depicts example word line program orders for a block with two sub-blocks, consistent with FIGS. 15 and 18A-18C.

FIG. 20 depicts example word line program orders for a block with three sub-blocks, consistent with FIGS. 16 and 18A-18C.

FIG. 21 depicts an example program order consistent with FIG. 20, where SB0 is programmed toward the source side of the block, then SB1 is programmed toward the drain side of the block, then SB2 is programmed toward the drain side of the block.

FIG. 22 depicts an example program order consistent with FIG. 20, where SB2 is programmed toward the drain side of the block, then SB1 is programmed toward the source side of the block, then SB0 is programmed toward the source side of the block.

FIG. 25 depicts an example program order consistent with FIG. 23, where SB1 is programmed toward the source side of the block, then SB0 is programmed toward the source side of the block, then SB2 is programmed toward the drain side of the block, then SB3 is programmed toward the drain side of the block.

FIG. 26 depicts an example program order consistent with FIG. 23, where SB3 is programmed toward the drain side of the block, then SB2 is programmed toward the source side of the block, then SB1 is programmed toward the source side of the block, then SB0 is programmed toward the source side of the block.

FIG. 28 depicts an example arrangement of sub-blocks consistent with FIG. 17 where an interior sub-block SB1 cannot be programmed.

FIG. 29 depicts an example arrangement of sub-blocks consistent with FIG. 17 where interior sub-blocks SB1 and SB2 cannot be programmed.

FIG. 30A depicts an example configuration of a table consistent with FIGS. 18D and 24 in an initial configuration.

FIG. 30B depicts an example configuration of the table of FIG. 30A after SB0 is programmed.

FIG. 30C depicts an example configuration of the table of FIG. 30B after SB1 is programmed.

FIG. 30D depicts an example configuration of the table of FIG. 30C after SB2 is programmed.

FIG. 31A depicts an example configuration of a table consistent with FIGS. 18D and 25 in an initial configuration.

FIG. 31B depicts an example configuration of the table of FIG. 31A after SB1 is programmed.

FIG. 31C depicts an example configuration of the table of FIG. 31B after SB0 is programmed.

FIG. 31D depicts an example configuration of the table of FIG. 31C after SB2 is programmed.

DETAILED DESCRIPTION

Figure 2:
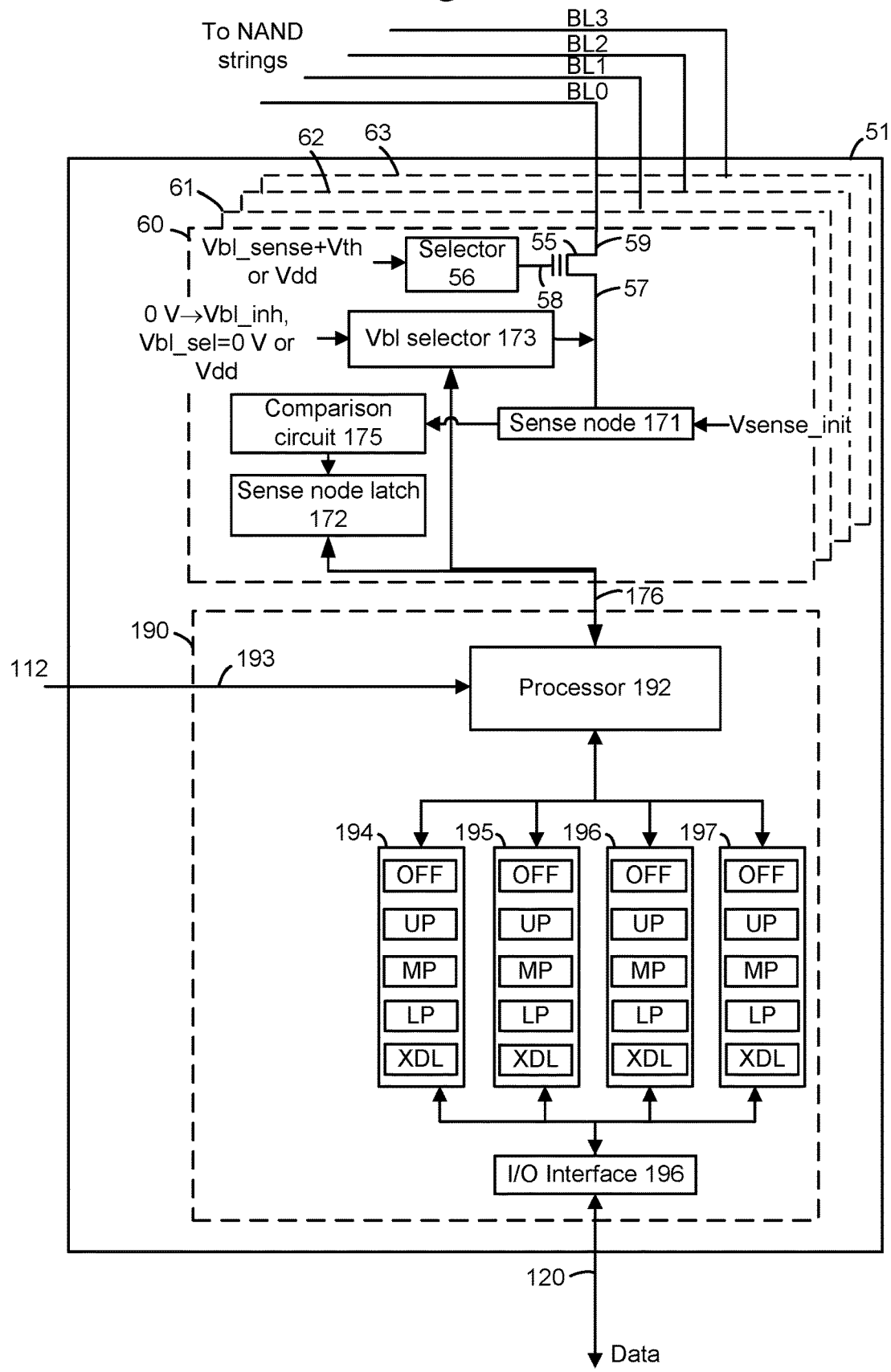
FIG. 2 is a block diagram depicting one embodiment of the sense block 51 of FIG. 1A.

Apparatuses and techniques are described for programming a multi-tier block in which sub-blocks are arranged in respective tiers.

In some memory devices, memory cells are connected to one another such as in NAND strings in a block. Each NAND string comprises a number of memory cells connected in series between one or more drain side select gate transistors (referred to as SGD transistors), on a drain side of the NAND string which is connected to a bit line, and one or more source side select gate transistors (referred to as SGS transistors), on a source side of the NAND string or other memory string or set of connected memory cells, which is connected to a source line. The select gate transistors are also referred to as select gates. Further, the memory cells can be arranged with a common control gate line (e.g., word line) which acts a control gate. A set of word lines extends from the source-side of a block to the drain-side of a block. Memory cells can be connected in other ways as well.

In a 2D memory structure, the memory cells may be arranged in horizontal NAND strings on a substrate.

Based on the desire for high storage density, 3D memory structures have been developed. In a 3D memory structure, the memory cells may be arranged in vertical NAND strings in a block, where the block comprises a stack of alternating conductive and dielectric layers. The conductive layers act as word lines which are connected to the memory cells. Each NAND string may have the shape of a pillar which intersects with the word lines to form the memory cells. Further, each NAND string includes various layers which extend vertically in the stack, such as a blocking oxide layer, a charge trapping layer, a tunneling layer and a channel layer.

To form the NAND strings, memory holes are etched vertically through the stack. However, there is a limit to the number of layers in which the holes can be accurately etched without excessive widening of the hole. One solution is to fabricate the stack in sections, one after another, where the memory holes are etched in separate portions in each section. The memory hole portion in each new section is aligned with the portion in the section below. A block comprising two or more tiers can be fabricated in this manner.

As the size of the block increases, various issues arise regarding block yield, block budget, data allocation efficiency/speed and garbage collection, for example.

Techniques provided herein address the above and other issues. In one aspect, a multi-tier block of memory cells is arranged in sub-blocks, where each sub-block comprises a respective tier of the block, one sub-block per tier. An individual sub-block of memory cells can be erased while remaining sub-blocks are inhibited from being erased. This allows the user to erase a smaller unit of memory cells rather than erasing the entire block. Additionally, if a defective word line is detected, the corresponding individual sub-block can be marked as bad while the remaining sub-blocks can still be used. There is no need to abandon the entire block.

A further advantage is that some types of data require a designated region which cannot be shared with other types of data. By allocating a sub-block instead of an entire block as the designated region, additional savings are achieved.

A further aspect involves optimizing pre-charging of the NAND string channels during a program operation. In particular, during programming, the channels of the unselected NAND strings are pre-charged to help inhibit programming when a program pulse is applied to a selected word line. The pre-charging involves applying a positive voltage via the bit line or source line before the program pulse is applied. Generally, when a program operation involves the source-side sub-block of a block, the NAND strings are pre-charged from the source line. When a program operation involves the drain-side sub-block of a block, the NAND strings are pre-charged from the bit line. When a program operation involves an interior sub-block, which is between the source- and drain-side sub-blocks, the NAND strings can be pre-charged from the bit line if all sub-blocks on the drain side of the interior sub-block are erased, or from the source line if all sub-blocks on the source side of the interior sub-block are erased.

If the interior sub-block is surrounded by programmed sub-blocks such that the NAND string channel portions in the interior sub-block cannot be pre-charged from the source or drain side, another sub-block is chosen for the program operation.

To determine whether an interior sub-block is surrounded by programmed sub-blocks, a table or other data structure can be provided which identifies free blocks, free sub-blocks and a corresponding word line programming program order. If such a table is not available, the surrounding sub-blocks can be read to determine whether they are programmed. Both edge word lines of an interior sub-block can be read to determine if the sub-block is programmed, since the word line program order is not known. A single edge word line of a source or drain-side sub-block block can be read to determine if the sub-block is programmed, since the word line program order is known.

In a further aspect, for a sub-block which is programmed, a word line program order can be defined which extends toward the side of the block from which the pre-charge voltage is provided.

In a further aspect, a number of bits per cell can be different for different sub-blocks. In one approach, a greater number of bits per cell are store in a drain-side sub-block than in a source-side sub-block. For example, the drain-side sub-block can be reserved for multi-level cells (MLC), with more than one bit per cell, while the source-side sub-block is reserved for single-level cells (SLC), with a single bit per cell.

These and other features are discussed further below.

FIG. 1A is a block diagram of an example storage device. The memory device 100, such as a non-volatile storage system, may include one or more memory die 108. The memory die 108, or chip, includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks 51, 52, . . . 53 (sensing circuitry) and allow a page of memory cells to be read or programmed in parallel. Typically a controller 122 is included in the same memory device 100 (e.g., a removable storage card) as the one or more memory die 108. The controller may be on a die 127 which is separate from the memory die 108. Commands and data are transferred between the host 140 and controller 122 via a data bus 120, and between the controller and the one or more memory die 108 via lines 118.

The memory structure can be 2D or 3D. The memory structure may comprise one or more array of memory cells including a 3D array. The memory structure may comprise a monolithic 3D memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine, an on-chip address decoder 114, and a power control circuit 115. A storage region 113 may be provided, e.g., for operational parameters and software/code. In one embodiment, the state machine is programmable by the software. In other embodiments, the state machine does not use software and is completely implemented in hardware (e.g., electrical circuits).

The on-chip address decoder 114 provides an address interface between that used by the host or a memory controller to the hardware address used by the decoders 124 and 132. The power control circuit 115 controls the power and voltages supplied to the word lines, select gate lines, bit lines and source lines during memory operations. It can include drivers for word lines, SGS and SGD transistors and source lines. See also FIG. 3. The sense blocks can include bit line drivers, in one approach.

The control circuitry 110 may include hardware, software and/or firmware for performing the processes described herein.

In some implementations, some of the components can be combined. In various designs, one or more of the components (alone or in combination), other than memory structure 126, can be thought of as at least one control circuit which is configured to perform the techniques described herein including the steps of the processes described herein. For example, a control circuit may include any one of, or a combination of, control circuitry 110, state machine 112, decoders 114 and 132, power control circuit 115, sense blocks 51, 52, . . . , 53, read/write circuits 128, controller 122, and so forth. The state machine is an electrical circuit that can control operations of the control circuitry 110. In some embodiments, the state machine is implemented by or replaced by a microprocessor, microcontroller and/or RISC processor.

The off-chip controller 122 (which in one embodiment is an electrical circuit) may comprise a processor 122e, memory such as ROM 122a and RAM 122b and an error-correction code (ECC) engine 245. The ECC engine can correct a number of read errors. The RAM 122b can be a DRAM which stores non-committed data, for example. During programming, a copy of the data to be programmed is stored in the RAM 122b until the programming is successfully completed. In response to the successful completion, the data is erased from the RAM 122b and is committed or released to the block of memory cells. The RAM 122b may store one or more word lines of data.

A memory interface 122d may also be provided. The memory interface, in communication with ROM, RAM and processor, is an electrical circuit that provides an electrical interface between controller and memory die. For example, the memory interface can change the format or timing of signals, provide a buffer, isolate from surges, latch I/O and so forth. The processor can issue commands to the control circuitry 110 (or any other component of the memory die) via the memory interface 122d.

The memory in the controller 122, such as such as ROM 122a and RAM 122b, comprises code such as a set of instructions, and the processor is operable to execute the set of instructions to provide the functionality described herein. Alternatively or additionally, the processor can access code from a subset 126a of the memory structure, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122e fetches the boot code from the ROM 122a or the subset 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below and provide the voltage signals including those discussed further below. A control circuit can be configured to execute the instructions to perform the functions described herein.

In one embodiment, the host is a computing device (e.g., laptop, desktop, smartphone, tablet, digital camera) that includes one or more processors, one or more processor readable memory devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory (DRAM) or static random access memory (SRAM) devices, non-volatile memory devices, such as resistive random access memory (ReRAM), electrically erasable programmable read-only memory (EEPROM), flash memory (which can also be considered a subset of EEPROM), ferroelectric random access memory (FRAM), and magnetoresistive random access memory (MRAM), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/ or over a substrate may be arranged in two or three dimensions, such as a 2D memory structure or a 3D memory structure.

In a 2D memory structure, the semiconductor memory elements are arranged in a single plane or a single memory device level. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. See an example column in FIG. 5. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the 2D and 3D exemplary structures described but covers all relevant memory structures within the spirit and scope of the technology as described herein and as understood by one of skill in the art.

FIG. 1B is a block diagram of an arrangement of the memory device 100 of FIG. 1A in which a control circuit 130 on a first die 130a communicates with the memory structure 126 on a separate second die 126b. The control circuit may communicate with the memory structure and the die 126b via a memory interface 131, for example, similar to the memory interface 122d. Examples of a memory interface (I/F) include the Common Flash Memory Interface of JEDEC. The techniques described herein can be implemented with a control die 130a bonded to one or more memory die 126b, where the memory die includes the memory structure 126 and the control die includes a control circuit 130 representing all, or subset, of the peripheral circuits of the memory structure. The control circuit can be on the same die as the plurality of memory cells, or on a different die than the plurality of memory cells.

For example, the memory structure may contain non-volatile memory cells. In some embodiments, the memory die and the control die are bonded together. The control circuit 130 can comprise a set of electrical circuits that perform memory operations (e.g., write, read, erase and others) on the memory structure. The control circuit can include the state machine 112, storage region 113, on-chip address decoder 114 and power control circuit 115. In another embodiment, one portion of the read/write circuits 128 are located on the control die 130a and another portion of the read/write circuits are located on memory die 126b. For example, the read/write circuits may contain sense amplifiers. The sense amplifiers can be located on the control die and/or the memory die.

In an example implementation, the control circuit 130 is configured to connect to a NAND string and a substrate, and the memory interface 131 is connected to the control circuit. The circuit can be configured to issue command via the memory interface to apply different voltage signals to bit lines, word lines, select gate lines, and a source line, for example. The circuit can be configured to issue command via the memory interface to implement the techniques discussed herein.

The term "memory die" can refer to a semiconductor die that contains non-volatile memory cells for storage of data. The term, "control circuit die" can refer to a semiconductor die that contains control circuitry for performing memory operations on non-volatile memory cells on a memory die. Typically, numerous semiconductor die are formed from a single semiconductor wafer.

FIG. 2 is a block diagram depicting one embodiment of the sense block 51 of FIG. 1A. An individual sense block 51 is partitioned into one or more core portions, referred to as sense circuits 60-63 or sense amplifiers, and a common portion, referred to as a managing circuit 190. In one embodiment, each sense circuit is connected to a respective bit line which in turn is connected to one or more NAND strings. For example, in a configuration consistent with FIG. 7A, each bit line is connected to four NAND strings, with one NAND string per sub-block. A common managing circuit 190 is connected to a set of multiple, e.g., four or eight, sense circuits. Each of the sense circuits in a group communicates with the associated managing circuit via data bus 176. Thus, there are one or more managing circuits which communicate with the sense circuits of a set of storage elements (memory cells).

The sense circuit 60, as an example, operates during a program loop to provide a pre-charge/program-inhibit voltage to an unselected bit line or a program-enable voltage to a selected bit line. An unselected bit line is connected to an unselected NAND string and to an unselected memory cell therein. An unselected memory cell can be a memory cell in an unselected NAND string, where the memory cell is connected to a selected or unselected word line. An unselected memory cell can also be a memory cell in a selected NAND string, where the memory cell is connected to an unselected word line. A selected bit line is connected to a selected NAND string and to a selected memory cell therein.

The sense circuit 60 also operates during a verify test in a program loop to sense a memory cell to determine whether it has completed programming by reaching an assigned data state, e.g., as indicated by its Vth exceeding the verify voltage of the assigned data state. The sense circuit 60 also operates during a read operation to determine the data state to which a memory cell has been programmed. The sense circuit 60 also operates in an erase operation during a verify test to determine whether a plurality of memory cells have a Vth below a verify voltage. As described further below, a verify test can be performed for the memory cells connected to all of the word lines in a block, or to memory cells connected to odd- or even-numbered word lines. The sense circuit performs sensing by determining whether a conduction current in a connected bit line is above or below a predetermined threshold level. This indicates whether the Vth of the memory cell is below or above, respectively, the word line voltage.

The sense circuit may include a selector 56 or switch connected to a transistor 55 (e.g., an nMOS). Based on voltages at the control gate 58 and drain 57 of the transistor 55, the transistor can operate as a pass gate or as a bit line clamp. When the voltage at the control gate is sufficiently higher than the voltage on the drain, the transistor operates as a pass gate to pass the voltage at the drain to the bit line (BL) at the source 59 of the transistor. For example, a program-inhibit voltage such as 1-2 V may be passed when pre-charging and inhibiting an unselected NAND string. Or, a program-enable voltage such as 0 V may be passed to allow programming in a selected NAND string. The selector 56 may pass a power supply voltage Vdd, e.g., 3-4 V to the control gate of the transistor 55 to cause it to operate as a pass gate.

When the voltage at the control gate is lower than the voltage on the drain, the transistor 55 operates as a source-follower to set or clamp the bit line voltage at Vcg-Vth, where Vcg is the voltage on the control gate 58 and Vth, e.g., 0.7 V, is the threshold voltage of the transistor 55. This assumes the source line is at 0 V. If Vsrc is non-zero, the bit line voltage is clamped at Vcg-Vsrc-Vth. The transistor is therefore sometimes referred to as a bit line clamp (BLC) transistor, and the voltage Vcg on the control gate 58 is referred to as a bit line clamp voltage, Vblc. This mode can be used during sensing operations such as read and verify operations. The bit line voltage is thus set by the transistor 55 based on the voltage output by the selector 56. For example, the selector 56 may pass Vbl_sense+Vth, e.g., 1.5 V, to the control gate of the transistor 55 to provide Vbl_sense, e.g., 0.8 V, on the bit line. A Vbl selector 173 may pass a relatively high voltage such as Vdd to the drain 57, which is higher than the control gate voltage on the transistor 55, to provide the source-follower mode during sensing operations. Vbl refers to the bit line voltage.

The Vbl selector 173 can pass one of a number of voltage signals. For example, the Vbl selector can pass a program-inhibit voltage signal which increases from an initial voltage, e.g., 0 V, to a program inhibit voltage, e.g., Vbl_inh for respective bit lines of unselected NAND string during a program loop. The Vbl selector 173 can pass a program-enable voltage signal such as 0 V for respective bit lines of selected NAND strings during a program loop. The Vbl selector may select a voltage signal from the BL voltage driver 340 in FIG. 3 based on commands from the processor 192, for example.

In one approach, the selector 56 of each sense circuit can be controlled separately from the selectors of other sense circuits. The Vbl selector 173 of each sense circuit can also be controlled separately from the Vbl selectors of other sense circuits.

During sensing, a sense node 171 is charged up to an initial voltage, Vsense_init, such as 3 V. The sense node is then passed to the bit line via the transistor 55, and an amount of decay of the sense node is used to determine whether a memory cell is in a conductive or non-conductive state. The amount of decay of the sense node also indicates whether a current Icell in the memory cell exceeds a reference current, Iref. If Icell<=Iref, the memory cell is in a non-conductive state and if Icell>Iref, the memory cell is in a conductive state.

In particular, the comparison circuit 175 determines the amount of decay by comparing the sense node voltage to a trip voltage at a sense time. If the sense node voltage decays below the trip voltage, Vtrip, the memory cell is in a conductive state and its Vth is at or below the verify voltage. If the sense node voltage does not decay below Vtrip, the memory cell is in a non-conductive state and its Vth is above the verify voltage. A sense node latch 172 is set to 0 or 1, for example, by the comparison circuit 175 based on whether the memory cell is in a conductive or non-conductive state, respectively. For example, in a program-verify test, a 0 can denote fail and a 1 can denote pass. The bit in the sense node latch can be read out in a state bit scan operation of a PCHSEL operation, or flipped from 0 to 1 in an FF fill operation.

The bit in the sense node latch can also be used in a lockout scan to decide whether to set a bit line voltage to an inhibit or program level in a next program loop. The latches 194-197 may be considered to be data state latches or user data latches because they store the data to be programmed into the memory cells.

The managing circuit 190 comprises a processor 192, four example sets of data latches 194-197 for the sense circuits 60-63, respectively, and an I/O interface 196 coupled between the sets of data latches and the data bus 120. Each set of data latches can include a data transfer latch XDL and user data latches. With three bits per cell, for example, the data transfer latches LP, MP and UP can be used to store data for a lower, middle and upper page of data, respectively. An offset latch OFF can be used to track whether a memory cell has completed a verify test using an offset verify voltage, which is lower than the final verify voltage of a data state. When a memory cell has a Vth greater than the offset verify voltage of its assigned data state, but lower than the final verify voltage of its assigned data state, it will be programmed with a reduced programming speed during the next program pulse by applying an elevated bit line voltage such as 0.7 V. The XDL latch is used to transfer data to and from the user data latches LP, MP and UP.

The processor 192 performs computations, such as to determine the data stored in the sensed memory cell and store the determined data in the set of data latches. Each set of data latches 194-197 is used to store data bits determined by processor 192 during a read operation, and to store data bits imported from the data bus 120 during a program operation which represent write data meant to be programmed into the memory. I/O interface 196 provides an interface between data latches 194-197 and the data bus 120.

During reading, the operation of the system is under the control of state machine 112 that controls the supply of different control gate voltages to the addressed memory cell. As it steps through the various predefined control gate voltages corresponding to the various memory states supported by the memory, the sense circuit may trip at one of these voltages and a corresponding output will be provided from sense circuit to processor 192 via the data bus 176. At that point, processor 192 determines the resultant memory state by consideration of the tripping event(s) of the sense circuit and the information about the applied control gate voltage from the state machine via input lines 193. It then computes a binary encoding for the memory state and stores the resultant data bits into data latches 194-197.

Some implementations can include multiple processors 192. In one embodiment, each processor 192 will include an output line (not depicted) such that each of the output lines is connected in a wired-OR connection. A wired OR connection or line can be provided by connecting multiple wires together at a node, where each wire carries a high or low input signal from a respective processor, and an output of the node is high if any of the input signals is high. In some embodiments, the output lines are inverted prior to being connected to the wired-OR line. This configuration enables a quick determination during a program verify test of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense circuits, the state machine needs to read the wired-OR line eight times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations for memory cells, the data to be programmed (write data) is stored in the set of data latches 194-197 from the data bus 120. During reprogramming, a respective set of data latches of a memory cell can store data indicating when to enable the memory cell for reprogramming based on the program pulse magnitude.

The program operation, under the control of the state machine, applies a series of programming voltage pulses to the control gates of the addressed memory cells. Each voltage pulse may be stepped up in magnitude from a previous program pulse by a step size in a processed referred to as incremental step pulse programming. Each program voltage is followed by a verify operation to determine if the memory cells has been programmed to the desired memory state. In some cases, processor 192 monitors the read back memory state relative to the desired memory state. When the two agree, the processor 192 sets the bit line in a program inhibit mode such as by updating its latches. This inhibits the memory cell coupled to the bit line from further programming even if additional program pulses are applied to its control gate.

Each set of data latches 194-197 may be implemented as a stack of data latches for each sense circuit. In one embodiment, there are three data latches per sense circuit 60. In some implementations, the data latches are implemented as a shift register so that the parallel data stored therein is converted to serial data for data bus 120, and vice versa. All the data latches corresponding to the read/write block of memory cells can be linked together to form a block shift register so that a block of data can be input or output by serial transfer. In particular, the bank of read/write circuits is adapted so that each of its set of data latches will shift data in to or out of the data bus in sequence as if they are part of a shift register for the entire read/write block.

The data latches identify when an associated memory cell has reached certain milestones in a program operations. For example, latches may identify that a memory cell's Vth is below a particular verify voltage. The data latches indicate whether a memory cell currently stores one or more bits from a page of data. For example, the LP, MP and UP latches can be flipped (e.g., from 0 to 1) when a lower, middle, upper or top page bit, respectively, is stored in an associated memory cell. All 1's in the latches indicate that an associated memory cell has completed programming.

Figure 3:
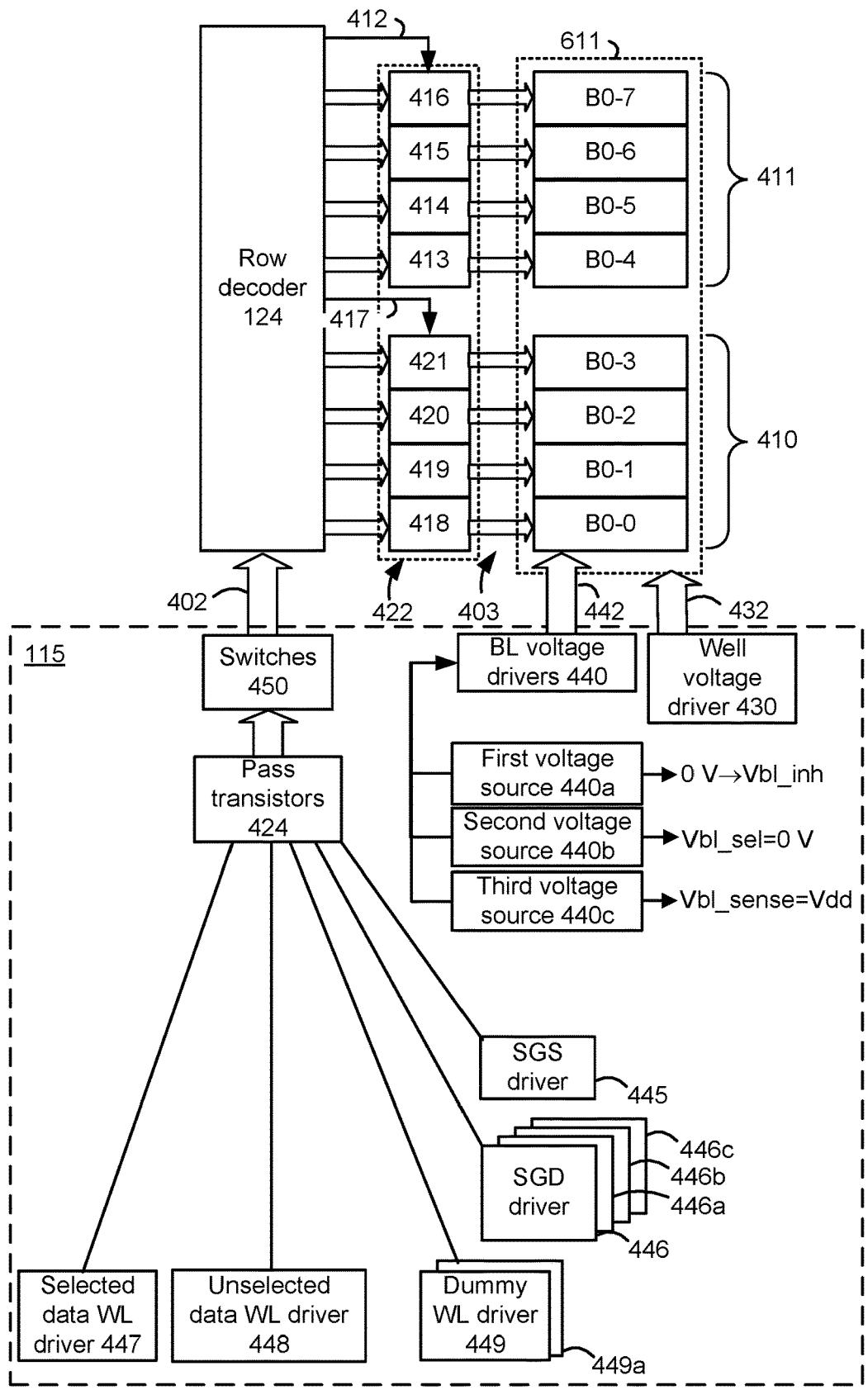
FIG. 3 depicts an example implementation of the power control circuit 115 of FIG. 1A for providing voltages to blocks of memory cells.

FIG. 3 depicts an example implementation of the power control circuit 115 of FIG. 1A for providing voltages to blocks of memory cells. The circuitry shown can be repeated for each plane of a die, in one approach. In this example, the memory structure 126 includes a set of four blocks, B0-0 to B0-3, in one plane, P0, and another set of four blocks, B1-0 to B1-3, in another plane, P1, consistent with FIG. 4. Generally, the blocks can be in one or more planes. The row decoder 124 of FIG. 1A provides voltages to word lines and select gate control lines of each block via pass transistors 422. In one approach, a separate row decoder is provided for each block. The row decoder can be provided one side of a block. The row decoder provides a control signal to pass transistors which connect the blocks to the row decoder. In one approach, the pass transistors of each set of blocks are controlled by a common control gate voltage. Thus, the pass transistors for a set of blocks are either all on or off at a given time. If the pass transistors are on, a voltage from the row decoder is provided to the respective control gate lines or word lines. If the pass transistors are off, the row decoder is disconnected from the respective control gate lines or word lines so that the voltage floats on the respective control gate lines or word lines.

For instance, a control gate line 412 is connected to sets of pass transistors 413-416, which in turn are connected to control gate lines of B0-4 to B0-7, respectively. A control gate line 417 is connected to sets of pass transistors 418-421, which in turn are connected to control gate lines of B0-0 to B0-3, respectively.

Typically, program or read operations are performed on one selected sub-block at a time in a block. An erase operation may be performed on a selected block or sub-block. The row decoder can connect global control lines 402 to local control lines 403. The control lines represent conductive paths. Voltages are provided on the global control lines from a number of voltage drivers. Some of the voltage drivers may provide voltages to switches 450 which connect to the global control lines. Pass transistors 424 are controlled to pass voltages from the voltage drivers to the switches 450.

The voltage drivers can include a selected data word line (WL) driver 447, which provides a voltage on a data word line selected during a program or read operation. The driver 447 can provide a pre-charge voltage and a program voltage on WLn during a program loop of a program operation. A driver 448 can be used for unselected data word lines, and dummy word line drivers 449 and 449a can be used to provide voltages on dummy word lines WLDD and WLDS, respectively, in FIG. 5. For example, the driver 448 can be used to apply a pre-charge voltage and a pass voltage on the unselected word lines during a program loop of a program operation.

The voltage drivers can also include separate SGD drivers for each sub-block. For example, SGD drivers 446, 446a, 446b and 446c can be provided for NAND string groups NSG0, NSG1, NSG2 and NSG3, respectively, such as in FIG. 7A. In one option, an SGS driver 445 is common to the different sub-blocks in a block.

The various components, including the row decoder, may receive commands from a controller such as the state machine 112 or the controller 122 to perform the functions described herein.

The well voltage driver 430 provides a source voltage Vsrc to the substrate (FIG. 5) via control lines 432. The well voltage driver 430 is one example of a source line driver, where the well region is a source line, e.g., a conductive path connected to the source sides of the NAND strings. In one approach, the p-well region 592 is common to the blocks. A set of bit lines 442 is also shared by the blocks.

Bit line voltage drivers 440 include voltage sources which provide voltages to the bit lines. For example, the bit line voltage drivers can include a first voltage source 440a which is configured to output a program-inhibit voltage signal. This signal increases from an initial level such as 0 V to a final, peak level such as Vbl_inh (also referred to VHSA), to pre-charge a channel of a respective NAND string and prevent programming of memory cells in the NAND string.

The bit line voltage drivers can also include a second voltage source 440b which is configured to output a program-enable voltage signal. This signal can have a fixed voltage such as 0 V which allows programming to occur for a selected memory cell in a respective NAND string. The bit line voltage drivers can also include a third voltage source 440c which is configured to output a fixed voltage, Vbl_sense, which allows sensing to occur for a selected memory cell in the respective NAND string. The sensing can occur during a read or a verify test. The voltage sources 440a, 440b and 440c may be connected to the sense circuits and used to provide voltages to the Vbl selector 173 of FIG. 2, for example.

In a stacked memory device such as depicted in FIGS. 4 to 7B, sets of connected memory cells may be arranged in NAND strings which extend vertically upward from the substrate. The bottom (or source side) of each NAND string is in contact with the substrate, e.g., the well region, and the top end (or drain side) of each NAND string is connected to a respective bit line, in one approach.

Figure 4:
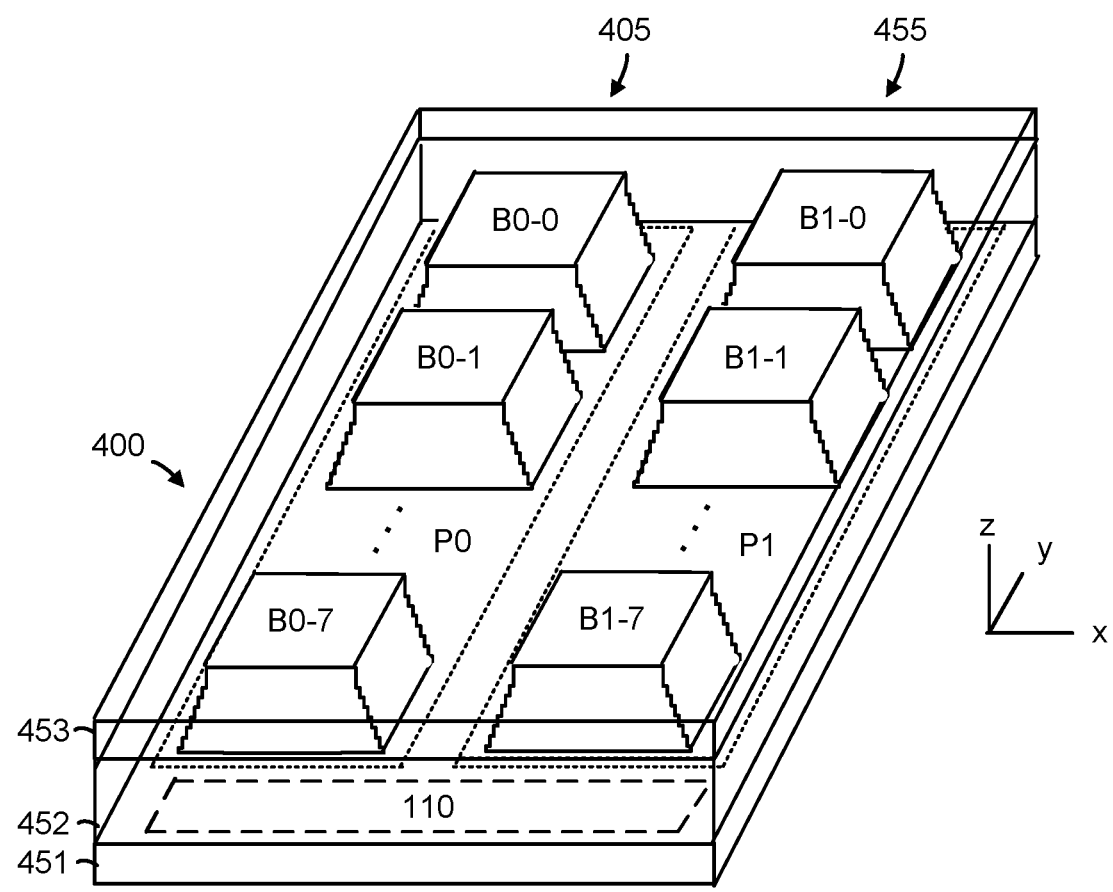
FIG. 4 is a perspective view of an example memory die 400 in which blocks are provided in respective planes P0 and P1, consistent with FIG. 3.

FIG. 4 is a perspective view of an example memory die 400 in which blocks are provided in respective planes P0 and P1, consistent with FIG. 3. The memory die includes a substrate 451, an intermediate region 452 in which blocks of memory cells are formed, and an upper region 453 in which one or more upper metal layers are patterned such as to form bit lines. Planes P0 and P1 represent respective isolation regions which are formed in the substrate 451. Further, a first block sequence 405 of a number n blocks, labelled B0-0 to B0-n−1, are formed in P0, and a second block sequence 455 of a number n blocks, labelled B1-0 to B1-n−1, are formed in P1. Each plane may have associated row and column control circuitry, such as the row decoder 124, read/write circuits 128 and column decoder 132 of FIG. 1A.

The control circuitry 110, which may be located in a peripheral area of the die, may be shared among the planes, in one approach. Each plane may have a separate set of bit lines.

By providing blocks of memory cells in multiple planes, parallel operations can be performed in the planes. For example, blocks in different planes can be erased concurrently.

The substrate 451 can also carry circuitry under the blocks, and one or more lower metal layers which are patterned in conductive paths to carry signals of the circuitry.

Figure 5:
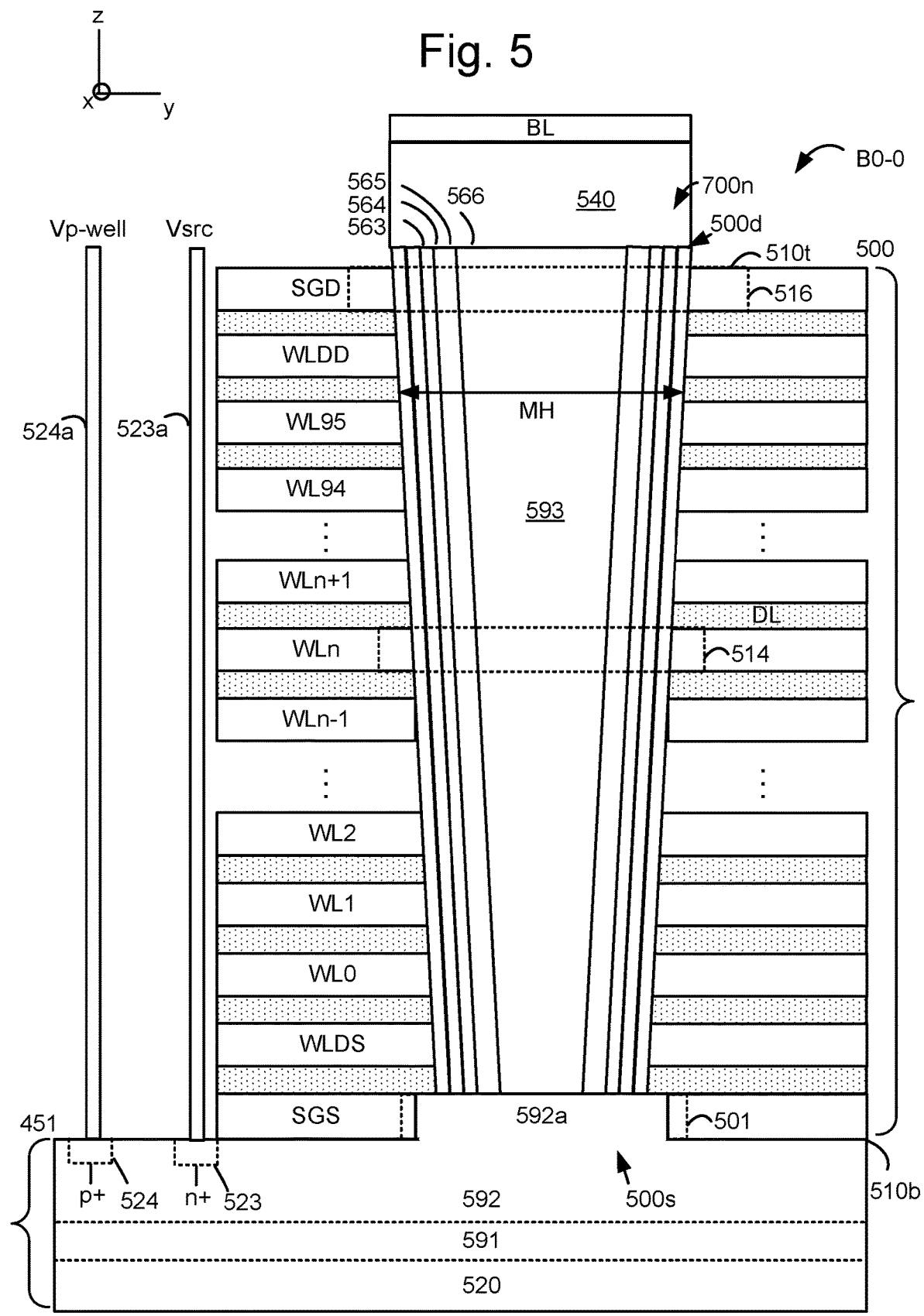
FIG. 5 depicts an example cross-sectional view of a portion of the block B0-0 of FIG. 4, including a NAND string 700n in a single tier configuration.

In this example, the memory cells are formed in vertical NAND strings in the blocks, consistent with FIG. 5. Each block comprises a stacked area of memory cells, where alternating levels of the stack represent word lines. In one possible approach, each block has opposing tiered sides from which vertical contacts extend upward to an upper metal layer to form connections to conductive paths. While two planes are depicted as an example, other examples can use four or more planes. One plane per die is also possible.

FIG. 5 depicts an example cross-sectional view of a portion of the block B0-0 of FIG. 4, including a NAND string 700n in a single tier configuration. The block comprises a stack 500 of alternating conductive layers (e.g., select gate layers and word line layers) and dielectric layers. The layers may be rectangular plates having a height in the z direction, a width in the y direction, and a length in the x direction. Example conductive layers include SGS, WLDS, WL0, WL1, WL2, . . . , WLn−1, WLn, WLn+1, . . . , WL94, WL95, WLDD and SGD. WLn denotes a selected word line for a read or program operation. The dielectric layers are shown by a dotted pattern and include an example dielectric layer DL. The conductive layers extend in a memory hole MH (see also FIG. 6).

The stack is depicted as comprising one tier comprising alternating conductive and dielectric layers. See FIG. 15-17 for multi-tier examples. A stack comprises a set of alternating conductive and dielectric layers in which a memory hole is formed in a fabrication process.

The conductive layers comprise SGS, WLDS, WL0-WL95, WLDD and SGD(0), in addition to 96 data word lines in this example, although the number of data word lines could be greater or less than 96.

The conductive layers which are connected to control gates of memory cells are referred to as word lines, and the conductive layers connected to control gates of source-side select gate transistors and drain-side select gate transistors are referred to as source-side and drain-side control lines, respectively. WLDS and WLDD are dummy word lines or conductive layers connected to dummy memory cells. A dummy memory cell may have the same construction as a data memory cell but is considered by the controller to be ineligible to store any type of data including user data. One or more dummy memory cells may be provided at the drain and/or source sides of a NAND string of memory cells to provide a gradual transition in the channel voltage gradient. WL0-WL95 are data word lines connected to data memory cells, which are eligible to store user data.

A top 510t (drain side) and bottom 510b (source side or substrate side) of the stack are depicted. WL95 is the topmost data word line and WL0 is the bottommost data word line.

The NAND strings are formed by etching memory holes in the stack, then depositing multiple thin layers of materials along the sidewalls of the memory holes. Memory cells are formed in a region in which the word lines intersect with the multiple thin layers, and select gate transistors are formed in regions in which the SGS and SGD control lines intersect with the multiple thin layers. For example, a drain-side select gate transistor 516 is formed where the SGD control line intersects with the multiple thin layers, a source-side select gate transistor 501 is formed where the SGS control line intersects with the multiple thin layers, and a selected memory cell 514 is formed where WLn intersects with the multiple thin layers.

The multiple thin annular layers can be deposited, e.g., using atomic layer deposition. For example, the layers can include a blocking oxide layer 563, a charge-trapping layer 564 or film such as silicon nitride ($Si_3N_4$) or other nitride, a tunneling layer 565 (e.g., a gate oxide) and a channel layer 566 (e.g., comprising polysilicon). A dielectric core 593 (e.g., comprising silicon dioxide) can also be provided. In this example, all of the layers are provided in the memory hole. In other approaches, some of the layers can be provided in the word line or control line layer. The multiple thin layers form a columnar active area of a NAND string. A word line or control line can comprise a metal such as Tungsten.

The stack is formed on the substrate 451. In one approach, the substrate includes a p-well region 592 connected to the source sides of the NAND strings. The p-well region may comprise an epitaxial region 592a which extends upward adjacent to the SGS layer. The p-well region can include an n+ contact 523 connected to a local interconnect 523a (a conductive path or source line) for receiving Vsrc, and a p+ contact 524 connected to a conductive path 524a for receiving Vp-well. The local interconnect and conductive path can comprise a conductive material such as metal surrounded by an insulating material to prevent conduction with the metal of the adjacent word lines. The p-well region 592 can be formed in an n-well 591, which in turn is formed in a p-type semiconductor region 520 of the substrate, in one possible implementation.

The NAND string 700n has a source side 500s at a bottom 510b of the stack 500, connected to the p-well. The NAND string 500n also has a drain side 500d at a top 510t of the stack, connected to a bit line BL0 via a bit line contact 540 comprising an n-type material.

The NAND string in this 3D configuration is considered to have a floating body channel because the length of the channel is not formed on a substrate.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. During an erase operation, the channels of the NAND string are charged up, such as by applying a positive erase pulse to the substrate, causing the electrons to return to the channel from the charge trapping layer.

Figure 6:
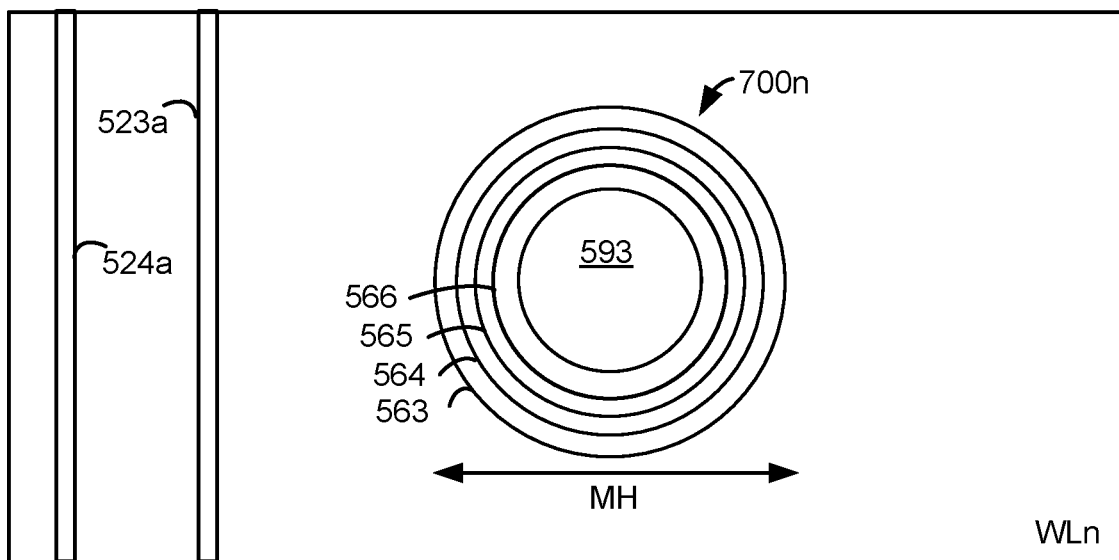
FIG. 6 depicts an example cross-sectional view of the block portion of FIG. 5 in the x-y plane at the level of WLn.

FIG. 6 depicts an example cross-sectional view of the block portion of FIG. 5 in the x-y plane at the level of WLn. The layers of the NAND string 700n are depicted, including the blocking oxide layer 563, charge-trapping layer 564, tunneling layer 565 and the channel layer 566. The dielectric core 593 is also depicted.

Figure 7A:
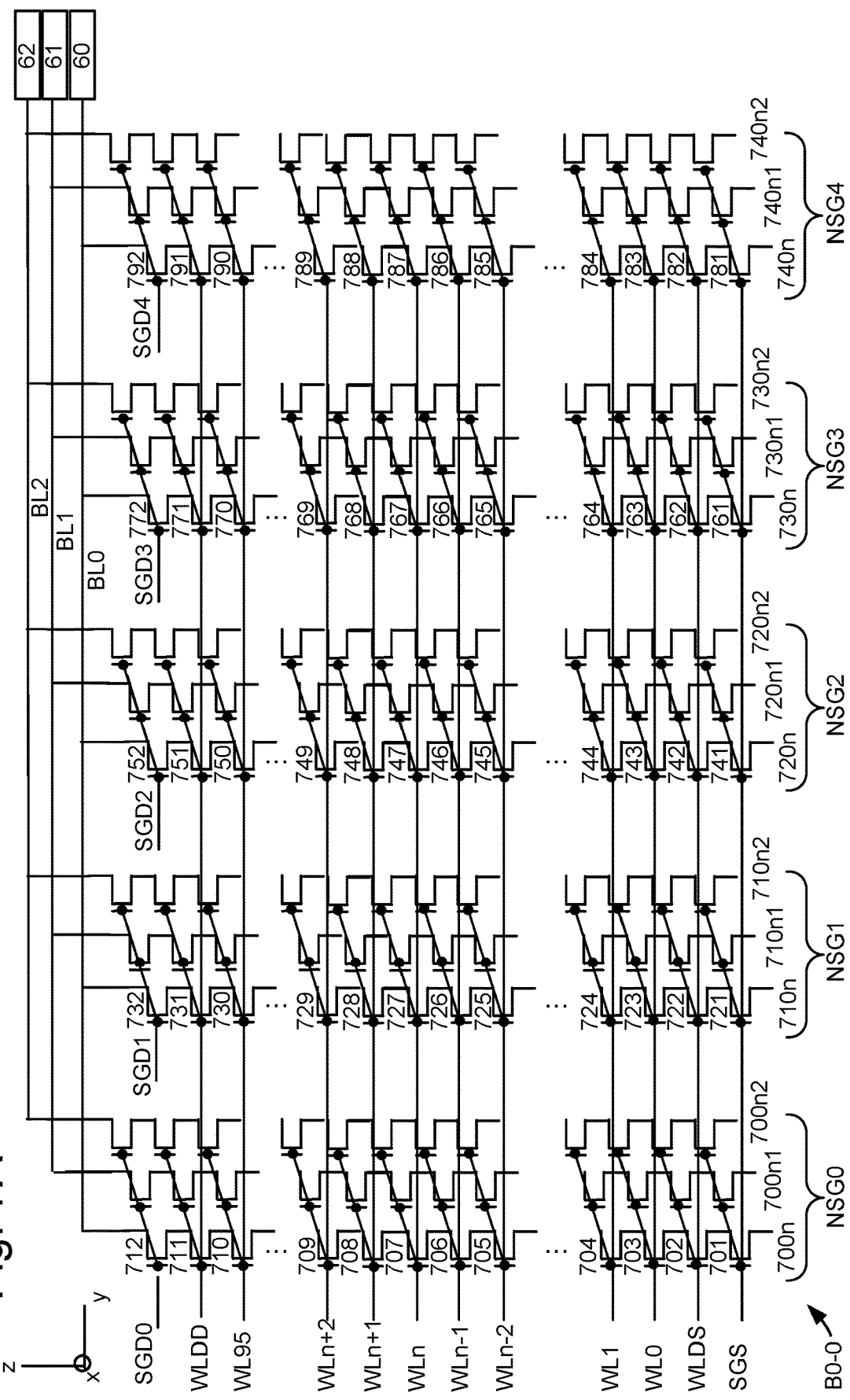
FIG. 7A depicts an example view of the block B0-0 of FIG. 4, with respective NAND strings arranged in NAND string groups NSG0-NSG4, along with associated bit lines and sense circuits.

FIG. 7A depicts an example view of the block B0-0 of FIG. 4, with respective NAND strings arranged in NAND string groups NSG0-NSG4, along with associated bit lines and sense circuits. The set of word lines WL0-WL95 are connected to memory cells arranged in NAND strings. The NAND strings are arranged in a 3D or vertical configuration. A NSG refers to a group of NAND strings having a common control gate layer for their SGD transistors. Typically, a NSG is a group of NAND strings programmed or read together. The block is consistent with FIG. 5. Three example NSGs are depicted, as a simplification. For example, NSG0 comprises NAND strings 700n, 700n1 and 700n2, NSG1 comprises NAND strings 710n, 710n1 and 710n2, NSG2 comprises NAND strings 720n, 720n1 and 720n2, NSG3 comprises NAND strings 730n, 730n1 and 730n2 and NSG4 comprises NAND strings 740n, 740n1 and 740n2. The NAND strings are connected to data word lines, dummy word lines and select gate lines. Each NSG comprises a set of NAND strings which extend in the x direction and which have a common SGD line or control gate layer. In particular, the SGD lines or layers SGD0-SGD4 are in NSG0-NSG4, respectively.

Programming of the block may occur based on a word line program order. One option is to divided the block into different sub-blocks in the z direction, and provide a separate word line program order for each sub-block. Additionally, the memory cells of different NSGs can be programmed one NSG at a time for each sub-block.

Reading can occur for memory cells connected to a selected word line in a selected NSG. Reading can also occur one NSG at a time.

In an erase operation, typically the entire block is erased. Another option is a partial block erase in which one or more selected sub-blocks are erased. In an erase operation for a sub-block, an erase-verify test can be performed for the entire sub-block block or for one NSG at a time.

Each NAND string comprises a plurality of memory cells between a SGS transistor and a SGD transistor, in this example. In other examples, more than one SGD and/or SGS transistor can be provided for each NAND string. The number of dummy memory cells can also vary. For example, the NAND string 700n includes a SGS transistor 701, a dummy memory cell 702, data memory cells 703-710, a dummy memory cell 711 and a SGD transistor 712. The NAND string 710n includes a SGS transistor 721, a dummy memory cell 722, data memory cells 723-730, a dummy memory cell 731 and a SGD transistor 732. The NAND string 720n includes a SGS transistor 741, a dummy memory cell 742, data memory cells 743-750, a dummy memory cell 751 and a SGD transistor 752. The NAND string 730n includes a SGS transistor 761, a dummy memory cell 762, data memory cells 763-770, a dummy memory cell 771 and a SGD transistor 772. The NAND string 740n includes a SGS transistor 781, a dummy memory cell 782, data memory cells 783-790, a dummy memory cell 791 and a SGD transistor 792.

This example depicts one SGD transistor at the drain side of each NAND string, and one SGS transistor at the source side of each NAND string. The SGD transistors in NSG0-NSG4 may be driven by separate control lines SGD0-SGD4, respectively, in one approach. In another approach, multiple SGD and/or SGS transistors can be provided in a NAND string.

A set of bit lines, including example bit lines BL0-BL2, are connected to the NAND strings. Each bit line is connected to a respective set of NAND strings, including one NAND string in each sub-block. For example, BL0 is connected to NAND strings 700n, 710n, 720n, 730n and 740n in NSG0-NSG4, respectively, BL1 is connected to NAND strings 700n1, 710n1, 720n1, 730n1 and 740n1 in NSG0-NSG4, respectively, and BL2 is connected to NAND strings 700n2, 710n2, 720n2, 730n2 and 740n2 in NSG0-NSG4, respectively. Each bit line is also connected to a respective sense circuit, consistent with the sense circuits of FIG. 2. For example, BL0-BL2 are connected to sense circuits 60-62, respectively.

Figure 7B:
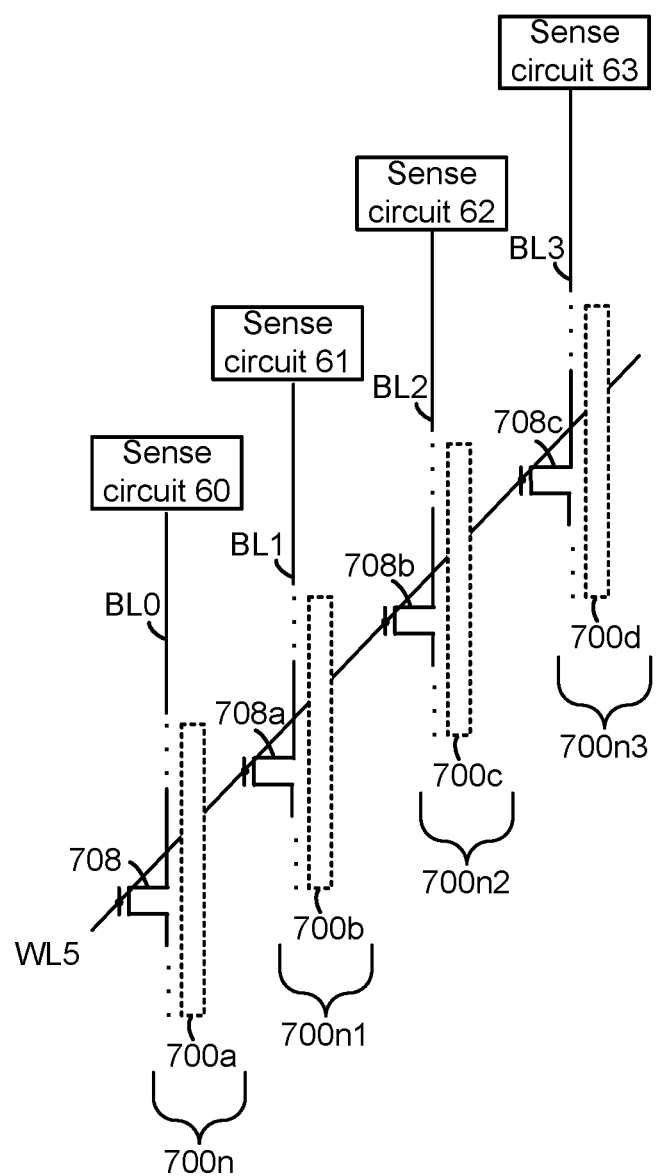
FIG. 7B depicts an example view of memory cells connected to WL5 in the NAND string group NSG0 of FIG. 7A, with respective NAND strings, bit lines and sense circuits.

FIG. 7B depicts an example view of memory cells connected to WL5 in the NAND string group NSG0 of FIG. 7A, with respective NAND strings, bit lines and sense circuits. The memory cell 708 and channel 700a of the NAND string 700n in NSG0 of FIG. 7A are depicted, along with a respective bit line BL0. NSG0 also includes memory cells 708a, 708b and 708c in NAND strings 700n1, 700n2 and 700n3, respectively, which have channels 700b, 700c and 700d, respectively, and which are connected to bit lines BL1, BL2 and BL3, respectively. The bit lines BL0-BL3 are connected to the sense circuits 60-63, respectively, of FIG. 2.

In a program loop, the memory cells 708 and 708a could be examples of selected memory cells, respectively, in which case the NAND strings 700n and 700n1 are examples of selected NAND strings. A bit line voltage which enables programming, e.g., 0 V, is applied to these bit lines when a program pulse is applied. The memory cells 708b and 708c could be examples of unselected memory cells, respectively, in which case the NAND strings 700n2 and 700n3 are examples of unselected NAND strings. A bit line voltage which inhibits programming, e.g., 1.5 V, is applied to these bit lines when a program pulse is applied.

FIG. 8 depicts a Vth distribution for a set of SLC memory cells. The erased (Er) state is represented by the Vth distribution 800, and the programmed state (P) is represented by the Vth distribution 801. The Er state is obtained by using an erase-verify voltage, Vslc_ev, and the P state is obtained using a program-verify voltage, Vslc_pv. Vr_slc is a read voltage for distinguishing between the two states. The Vth distribution 801a represents an erase disturb, discussed further in connection with FIG. 18E. Erase disturb can occur in an inhibited sub-block while a selected sub-block is being erased.

During an erase operation, the Vth of the memory cells is set below the erase-verify voltage. The erase operation is completed when all or nearly all of the memory cells have a Vth below this voltage. During the program operation, the Vth of the memory cells is set above a program-verify voltage. The program operation is completed when all or nearly all of the memory cells have a Vth above this voltage.

Figure 11:
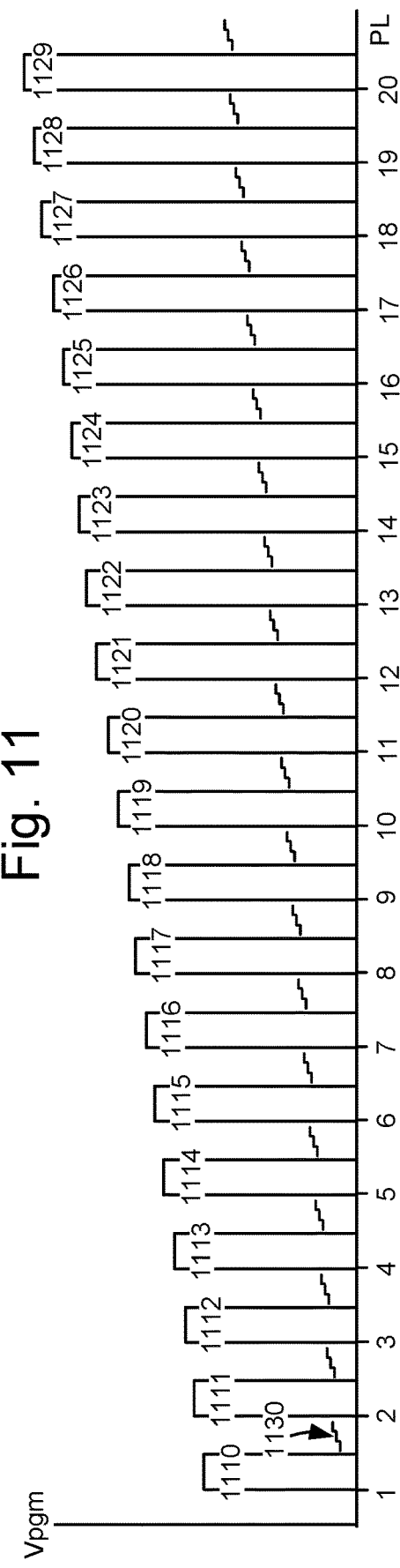
FIG. 11 depicts an example voltage signal 1100 applied to a selected word line in an MLC program operation, consistent with FIG. 10.

FIG. 9 depicts an example voltage signal 900 applied to a selected word line in an SLC program operation, consistent with FIG. 8. In FIGS. 9 and 11, the vertical axis depicts a number of memory cells on a logarithmic scale, and the horizontal axis depicts a Vth of the memory cells on a linear scale.

In a first program loop, a program pulse 901 with a magnitude of Vslc_pgm_init is applied to the selected word line, followed by a verify pulse 902 with a magnitude of Vslc_pv. In a second program loop, a program pulse 903 is applied to the selected word line followed by a verify pulse 904 with the magnitude of Vslc_pv. The program pulses can increase by a step size. In this example, the program operation is completed in the second program loop. SLC programming generally can be completed in a relatively small number of program loops, e.g., one, two or more loops, compared to MLC programming, since a wider Vth distribution for the programmed state, and a larger spacing between the erased state and the programmed state, are acceptable.

Figure 10:
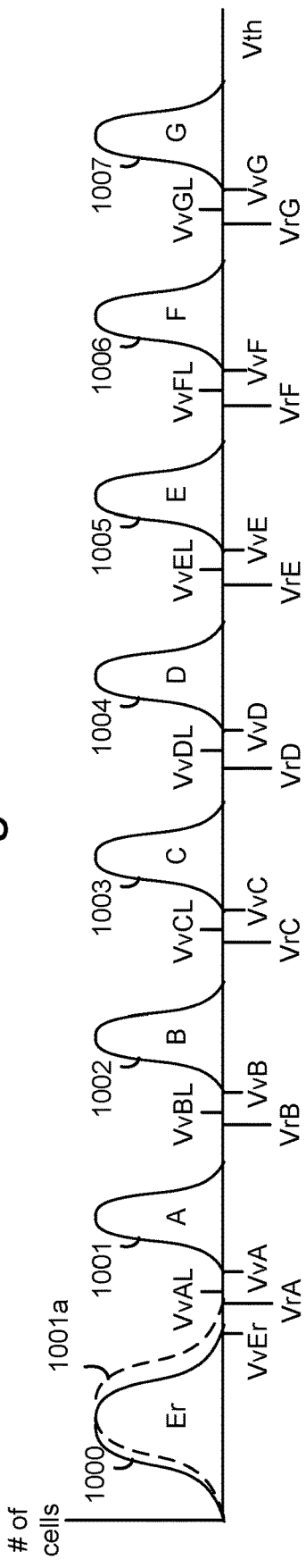
FIG. 10 depicts a Vth distribution of a set of memory cells with three bits per cell and eight data states.

FIG. 10 depicts a Vth distribution of a set of memory cells with three bits per cell and eight data states. Each memory cell may be associated with a data state according to write data in a program command. Based on its data state, a memory cell will either remain in the erased (Er) state or be programmed to a programmed data state. For example, in a one bit per cell memory device, there are two data states including the erased state and the programmed state. In a two-bit per cell memory device, there are four data states including the erased state and three programmed data states referred to as the A, B and C data states. In a three-bit per cell memory device, there are eight data states including the erased state and seven programmed data states referred to as the A, B, C, D, E, F and G data states. In a four-bit per cell memory device, there are sixteen data states including the erased state S0 and fifteen programmed data states S1-S15. Each data state can be represented by a range of threshold voltages (Vth) in the memory cells.

After the memory cells are programmed, the data can be read back in a read operation. A read operation can involve applying a series of read voltages to a word line while sensing circuitry determines whether cells connected to the word line are in a conductive (turned on) or non-conductive (turned off) state. If a cell is in a non-conductive state, the Vth of the memory cell exceeds the read voltage. The read voltages are set at levels which are expected to be between the threshold voltage levels of adjacent data states. Moreover, during the read operation, the voltages of the unselected word lines are ramped up to a read pass level or turn on level which is high enough to place the unselected memory cells in a strongly conductive state, to avoid interfering with the sensing of the selected memory cells. A word line which is being programmed or read is referred to as a selected word line, WLn.

In one approach, at a start of a program operation, the memory cells are all initially in the erased (Er) state, as represented by the Vth distribution 1000. After the program operation is successfully completed, the memory cells assigned to the A-G states are represented by the Vth distributions 1001-1007. The Vth distribution 1001a represents an erase disturb, discussed further in connection with FIG. 18E.

The memory cells which are programmed to the A-G states using final verify voltages of VvA-VvG, respectively, are represented by the Vth distributions 1001-1007, respectively. These Vth distributions are obtained just after completion of the program operation, and assume no program disturb or neighbor word line interference has occurred. The verify voltages are used in the program-verify tests of the memory cells. Optionally, an offset verify voltage can also be used which is lower than the final verify voltage of a data state. For example, the offset verify voltages for the A-G states are VvAL-VvGL, respectively. When a memory cell has a Vth between the offset verify voltage and the final verify voltage of its assigned data state, it is programmed with a reduced programming speed by applying an elevated bit line voltage such as 0.7 V during a program pulse. This is also referred to as a slow programming mode or quick pass write (QPW) mode. The elevated bit line voltage is less than the inhibit bit line voltage. See also FIG. 13 which depicts a verify test for the A state using the offset verify voltage VvAL and the final verify voltage VvA, and a verify test for the B state using the offset verify voltage VvBL and the final verify voltage VvB.

Read voltages VrA-VrG can be used for reading the states of the memory cells in a read operation.

In an erase operation, the data memory cells transition from the Vth distributions of the programmed data states, e.g., states A-G, to the erased state. The erase operation includes an erase phase in which the memory cells are biased for erasing followed by an erase-verify test. The erase-verify test can use an erase-verify voltage, VvEr, which is applied to the word lines. See also FIG. 1.

The Er-G states are examples of assigned data states, and the A-G states are examples of programmed data states, in this eight-state example.

FIG. 11 depicts an example voltage signal 1100 applied to a selected word line in an MLC program operation, consistent with FIG. 10. TLC (three-level cell) programming, with three bits per cell, and eight data states, is provided as an example. Other types of MLC programming can be used. In this example, the voltage signal includes twenty program loops PL1-PL20 with program pulses 1110-1129, respectively, and associated verify voltages. For example, verify voltages (plot 1130) are provided in PL1. The verify voltages are depicted in a simplified form, and can be provided for progressively higher data states as the programming proceeds. The program pulses can increase by a step size.

The voltages signals for programming in the MLC mode are similar to those in the SLC mode, except the verify voltages are for the programmed MLC states, and multiple verify voltages can be used in one program loop.

Figure 12:
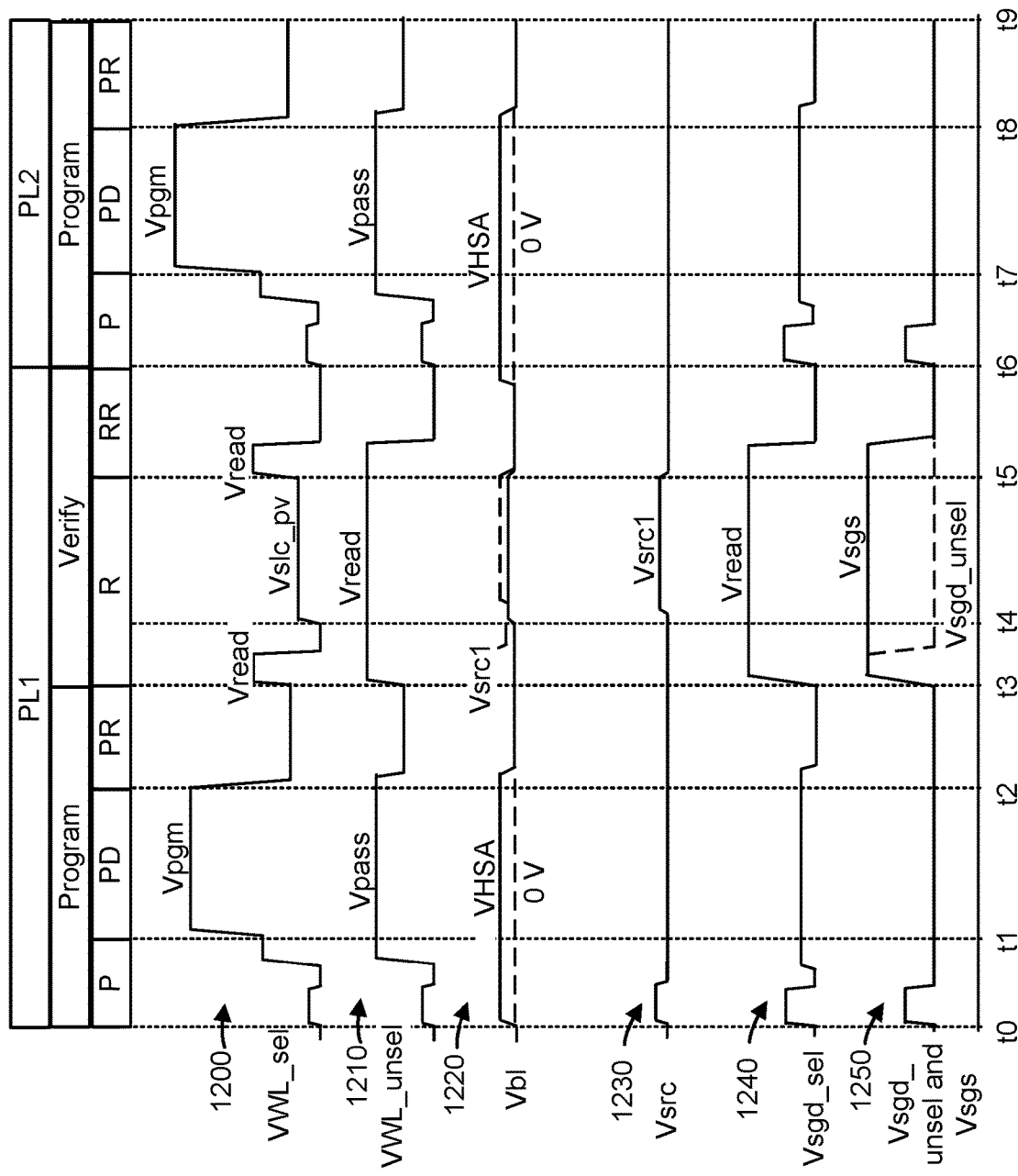
FIG. 12 depicts example voltage signals in first and second program loops of an SLC program operation, consistent with FIG. 9.

FIG. 12 depicts example voltage signals in first and second program loops of an SLC program operation, consistent with FIG. 9. Each program loop includes a program portion and a verify portion. Various time periods are depicted in the program and verify portions. For example, in the first program loop, PL1, the program portion comprises time periods P (a pre-charge phase) from t0-t1, PD (a program phase in which a program pulse Vpgm is applied) from t1-t2 and PR (a program recovery phase) from t2-t3. The verify portion comprises time periods R (a word line ramp up and verify phase) from t3-t5 and RR (a recovery phase) from t5-t6. In the second program loop, PL2, the program portion comprises time periods P from t6-t7, PD from t7-t8 and PR from t8-t9. The verify portion of PL2 is not depicted but is analogous to the verify portion of PL1.

A plot 1200 depicts a selected word line voltage, VWL_sel, a plot 1210 depicts an unselected word line voltage, VWL_unsel, a plot 1220 depicts a bit line voltage, Vbl, a plot 1230 depicts a source line voltage, Vsrc, a plot 1240 depicts a selected SGD transistor voltage, Vsgd_sel, and a plot 1250 depicts an unselected SGD transistor voltage, Vsgd_unsel, and a SGS transistor voltage, Vsgs.

In PL1, VWL_sel and Vwl_sel increase to a small positive level just after t0 to allow a pre-charge voltage to pass in the NAND string channel from the source or drain side of the NAND strings. A program pulse at a level of Vpgm is then applied, and a recovery period follows. Subsequently, VWL_sel may be spiked up to Vread, lowered to 0 V and then increased to Vslc_pv for the verify test. VWL_sel may be spiked up an additional time to Vread, and then lowered to 0 V at the end of PL1. The Vread spike before the verify test helps drain out residue electrons from the channels of the unselected NAND strings in the unselected sub-blocks. The Vread spike after the verify test is a channel clean voltage which equalizes the channel potential.

A similar pattern is repeated in PL2. VWL_unsel increases to a small positive level just after t6 to allow channel pre-charging and then increases to Vpass when the program pulse is applied. A recovery follows.

As mentioned, the channel pre-charge can occur from the source or drain side of the NAND strings. To pre-charge from the drain side, Vbl is increased from an initial level to a higher level, VHSA, at t0 for unselected NAND strings and kept at a lower level such as 0 V for selected NAND strings. Vsrc can remain at 0 V in this case. To pre-charge from the source side, Vsrc is temporarily increased to a higher level at t0 and Vbl can remain at 0 V.

During the verify test, Vbl is increased to a positive voltage, Vsrc1, for the unselected bit lines and to a higher level than Vsrc1 for the selected bit lines. Vbl is increased at t4 in PL1 for the verify portion of PL1. Vsrc1 is applied to the source line. With Vsrc1 at the source side and the drain side of the unselected NAND strings, no current will flow to the sense amp. In contrast, a current can flow in a selected NAND string, if the selected memory cell is conductive, when the drain has a higher bias than the source.

In the verify tests, Vbl is set to a level such as Vsense, e.g., 0.5 V, for selected NAND strings. A similar pattern is repeated in PL2.

Additionally, note that the ramp up of Vbl to VHSA for the unselected bit lines in PL2 can occur at the end of PL1, just before t6, in a process referred to as dynamic inhibit.

During the pre-charge, Vsgd_sel is elevated and Vbl_sel=0 V to provide the SGD transistor in a conductive state. Vsgd_sel is then returned to a lower level during the program pulse so that the SGD_sel transistor will be on or off if Vbl is low or high, respectively. With Vbl=Vbl_inh, the SGD transistors of the unselected NAND strings will be in a non-conductive state to inhibit programming.

Vsgd_unsel and Vsgs are elevated during the pre-charge to provide the SGD and SGS transistors in a conductive state, and then returned to 0 V during the program pulse. During the verify test, Vsgd_sel and Vsgs are set to Vread to provide the corresponding transistors in a conductive state to allow sensing to occur. Vsgd_unsel is spiked up to Vread at t3 and then kept at 0 V while Vbl_inh is set to provide the corresponding SGD transistors in a non-conductive state, to avoid interfering with the sensing of the selected NAND strings. The spiking of Vsgd_unsel to Vread helps drain out residue electrons from the channels of the unselected NAND strings in the unselected sub-blocks.

Figure 13:
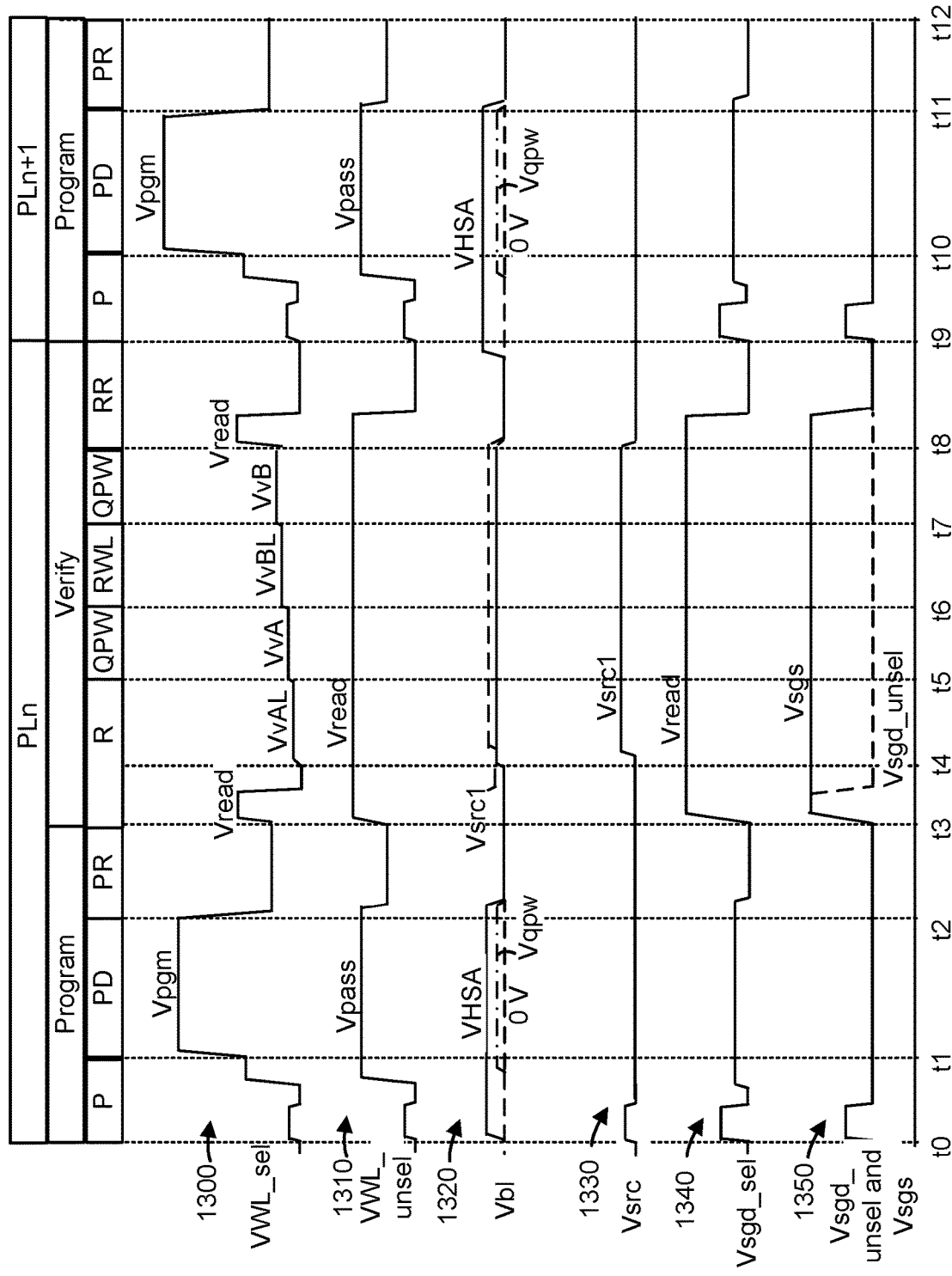
FIG. 13 depicts example voltage signals in nth and n+1st program loops of an MLC program operation, consistent with FIG. 10.

FIG. 13 depicts example voltage signals in nth and n+1st program loops of an MLC program operation, consistent with FIG. 10. Along with the program and verify portions of PLn, the program portion of PLn+1 is shown. The verify portion in PLn+1 is not depicted but is analogous to the verify portion in PLn. The voltage signals are analogous to those in FIG. 12 except for the verify tests. In this example, verify tests using VvAL and VvA are done in PLn. As discussed in connection with FIG. 10, VvAL is an offset verify voltage of the A state and VvA is a final verify voltage of the A state. Verify tests for other data states could be performed as well.

In PLn, the program portion comprises time periods P from t0-t1, PD from t1-t2 and PR t2-t3. The verify portion comprises time periods R from t3-t5, QPW from t5-t6, RWL from t6-t7, QPW from t7-t8 and RR from t8-t9. In PLn+1, the program portion comprises time periods P from t9-t10, PD from t10-t11 and PR from t11-t12.

A plot 1300 depicts VWL_sel, a plot 1310 depicts VWL_unsel, a plot 1320 depicts Vbl, a plot 1330 depicts Vsrc, a plot 1340 depicts Vsgd_sel, and a plot 1350 depicts Vsgd_unsel and Vsgs. Vbl is increased at t4 in PLn for the verify portion.

In this example, two verify tests are performed for the A state using two word line voltages, VvAL and VvA, and two verify tests are performed for the B state using two word line voltages, VvBL and VvB, in a process referred to as quick pass write (QPW). This term is based on the ability to quickly program the memory cells in a program pass. The memory cells are programmed quickly initially and then slowed down as their Vth approaches the final verify voltage. However, performance is not optimized due to the time used to stabilize VWL_sel when transitioning from VvAL to VvA or from VvBL to VvB. Another approach involves a fast or intelligent QPW, referred to as iQPW. In this approach, for each state, a single word line voltage is applied while the two verify tests are performed in turn. The sense node is charged up to a higher level and a sensing operation is performed which indicates the Vth of the cell relative to the lower, offset verify voltage of a data state (e.g., VvAL or VvBL). The sensing operation involves discharging the sense node to a lower level. Subsequently, without charging up the sense again, a sensing operation is performed which indicates the Vth of the cell relative to the higher, final verify voltage of the data state (e.g., VvA or VvB).

Figure 14:
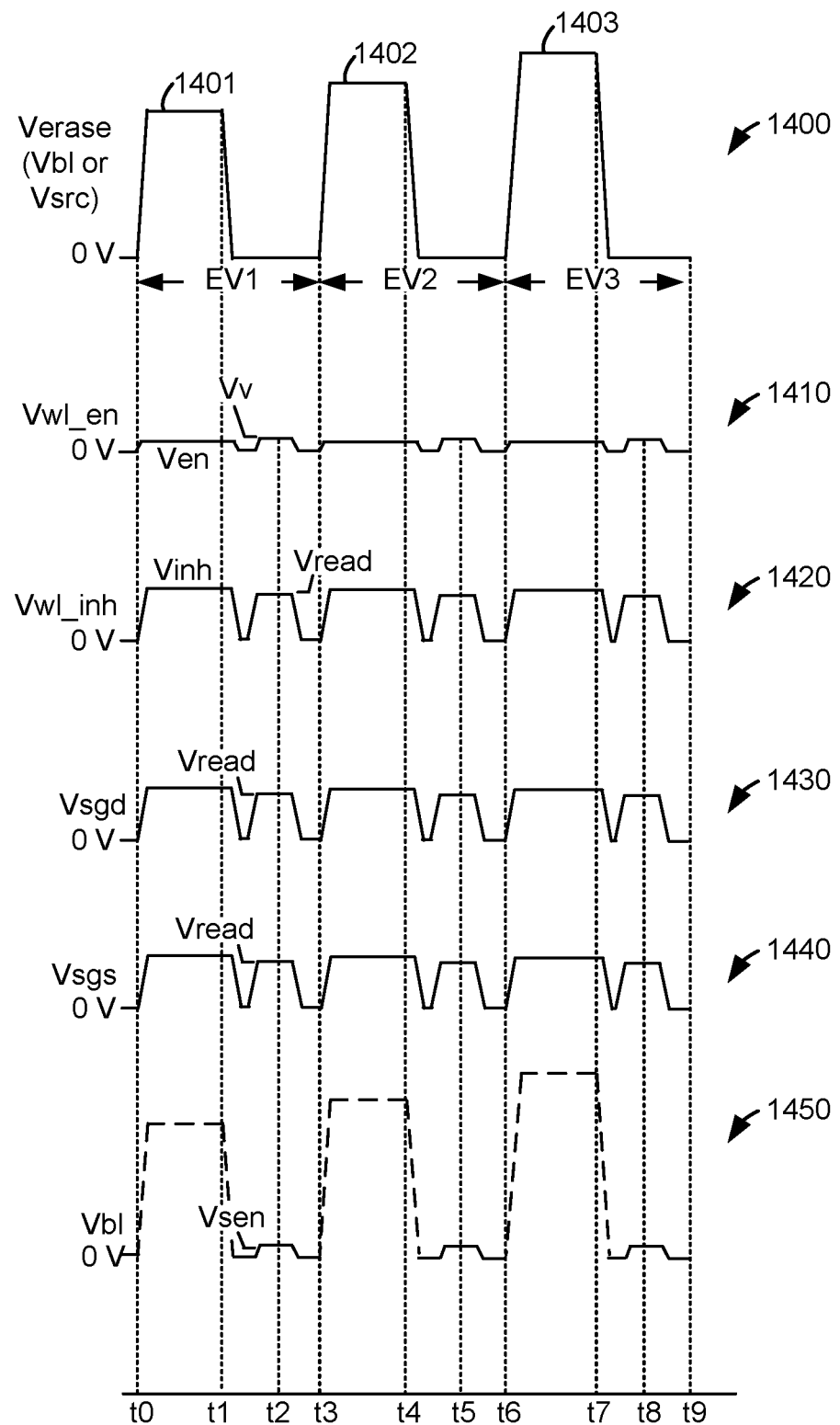
FIG. 14 depicts example voltage signals of an erase operation.

FIG. 14 depicts example voltage signals of an erase operation. The voltage signals extend over time points t0-t9. The vertical direction indicates voltage and the horizontal direction indicates time. As mentioned, an erase operation can involve one or more selected sub-blocks while other sub-blocks are inhibited from being erased. Thus, erasing can be enabled for some sub-blocks and inhibited in other sub-blocks.

An erase operation typically involves one or more erase-verify iterations, also referred to as erase loops, where each iteration involves channel boosting followed by a verify test for the memory cells, until the erase operation is completed. In this example, the erase operation has three erase-verify loops, EV1-EV300. An erase operation typically has multiple erase-verify loops. Each loop has an erase portion in which an erase pulse is applied to charge up the NAND string channels followed by a verify portion which includes an erase-verify test for the memory cells.

In an erase loop, the memory cells in the enabled sub-blocks are biased for erase by boosting the voltages of the NAND string channels while holding the voltages of the word lines at a low level, e.g., at or close to 0 V. The channels are boosted by applying one or more erase pulses to the block.

In one approach, the erase pulse, Verase, is applied to the p-well region of the substrate as Vsrc and/or Vp-well, causing holes to be injected into the channels via the source sides of the NAND strings.

In another approach, the erase pulse is applied to the bit lines as Vbl. This generates holes at the drain side of the NAND strings, at the SGD transistors, using gate-induced drain leakage (GIDL). In particular, the SGD transistors are reversed biased, e.g., with a positive drain-to-gate voltage, to generate electron-hole pairs. The bit line voltage exceeds a voltage at the control gate of the SGD transistors by a few Volts. The electrons are swept away by the electrical field and collected at the bit line terminal, while holes drift to the channel, toward a low voltage at the source side, to charge up the channel. It is also possible to generate GIDL at the SGS transistors.

The boosting of the channels creates a large channel-to-gate voltage which drives holes into the charge trapping layers, lowering the threshold voltage (Vth) of the memory cells. A verify test, which is a sensing operation, can be performed after the application of the erase pulse to determine if the Vth of the memory cells in the selected sub-block has been lowered below a verify voltage, Vv. For erasing SLC cells, Vv=Vslc_ev, consistent with FIG. 8. For erasing MLC cells, Vv=VvEr, consistent with FIG. 10. A verify test typically tests the erase level of a set of NAND strings by sensing a current in the set of NAND strings. The current can be indicated by the amount of voltage discharge of a sense node in a sense circuit. The erase operation is completed when the verify test is passed by all, or nearly all, of the sets of NAND strings.

A voltage signal 1400 depicts Verase including erase pulses 1401-1403. The first, second and third erase pulses are at t0-t1, t3-t4 and t6-t7, respectively. The erase voltage can involve a transition from 0 V to a peak voltage, e.g., 15-25 V, which is stepped up in successive erase-verify iterations after the first erase-verify iteration. The channel voltage of the NAND strings will be similar to, and slightly less than, Verase. As mentioned, Verase can be Vbl when the channel is charged from the drain side of the NAND strings using GIDL, or Vsrc and/or Vp-well when the channel is charged from the source side of the NAND strings.

A voltage signal 1410 depicts a voltage Vwl_en applied to the word lines in a sub-block for which erasing is enabled. During each erase pulse, this voltage signal increases from 0 V to Ven, an erase-enable voltage such as 0-0.5 V. Between the erase pulses, in the verify portion of the erase-verify loops, Vwl_en is set to an erase-verify voltage, e.g., VvEr for MLC mode or Vslc_ev for SLC mode, at which time a sensing operation (verify test) occurs. An example verify voltage is 0 V. The sensing occurs at t2, t5 and t8.

A voltage signal 1420 depicts a voltage Vwl_inh applied to word lines in a sub-block for which erasing is inhibited. During each erase pulse, this voltage signal increases from 0 V to an erase-inhibit voltage, Vinh, such as several Volts. In the verify portion of the erase-verify loops, Vwl_inh is set to Vread. Vinh is an erase-inhibit voltage such as 10 V, and Vread is a read pass voltage such as 8-10 V. Since Vinh is significantly higher than Ven, the memory cells in an unselected sub-block will have a significantly lower channel-to-gate voltage than the memory cells in a selected sub-block and will therefore be inhibited from being erased.

A voltage signal 1430 depicts a voltage applied to the SGD transistors, Vsgd. This voltage signal increases from 0 V to a higher level during each erase pulse. When the NAND strings are charged up from drain side, Vsgd is set at a few Volts below Verase to generate GIDL. When the NAND strings are charged up from source side, Vsgd can be set to a level similar to Vinh or Vread. In the verify portion of the erase-verify loops, Vsgd is set to Vread.

A voltage signal 1440 depicts a voltage applied to the SGS transistors, Vsgs. This voltage signal increases from 0 V to Vinh during each erase pulse. In the verify portion of the erase-verify loops, Vsgs is set to Vread.

A voltage signal 1450 depicts a voltage of the bit lines when the erase pulse is applied to the substrate. In this case, the bit line voltage floats higher as the channel voltage increases due to the hole injection from the substrate to the channel. The floating is denoted by the dashed lines. In the verify portion of the erase-verify loops, Vbl is set to Vsen. Vsen is a sensing voltage of the bit line such as 0.8 V.

Figure 15:
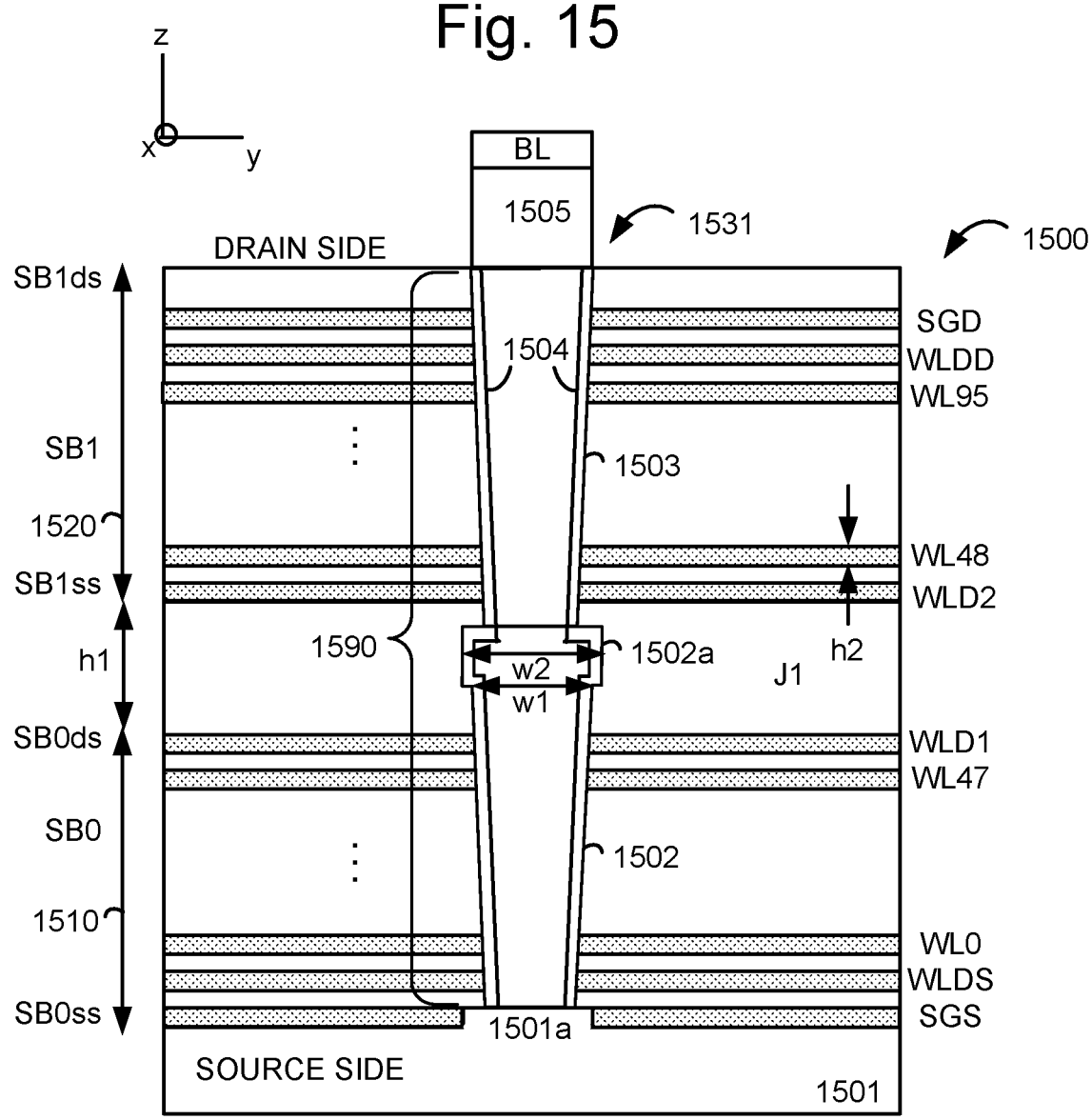
FIG. 15 depicts a portion of a two-tier block 1500 having sub-blocks SB0 and SB1 in tiers 1510 and 1520, respectively.
Figure 16:
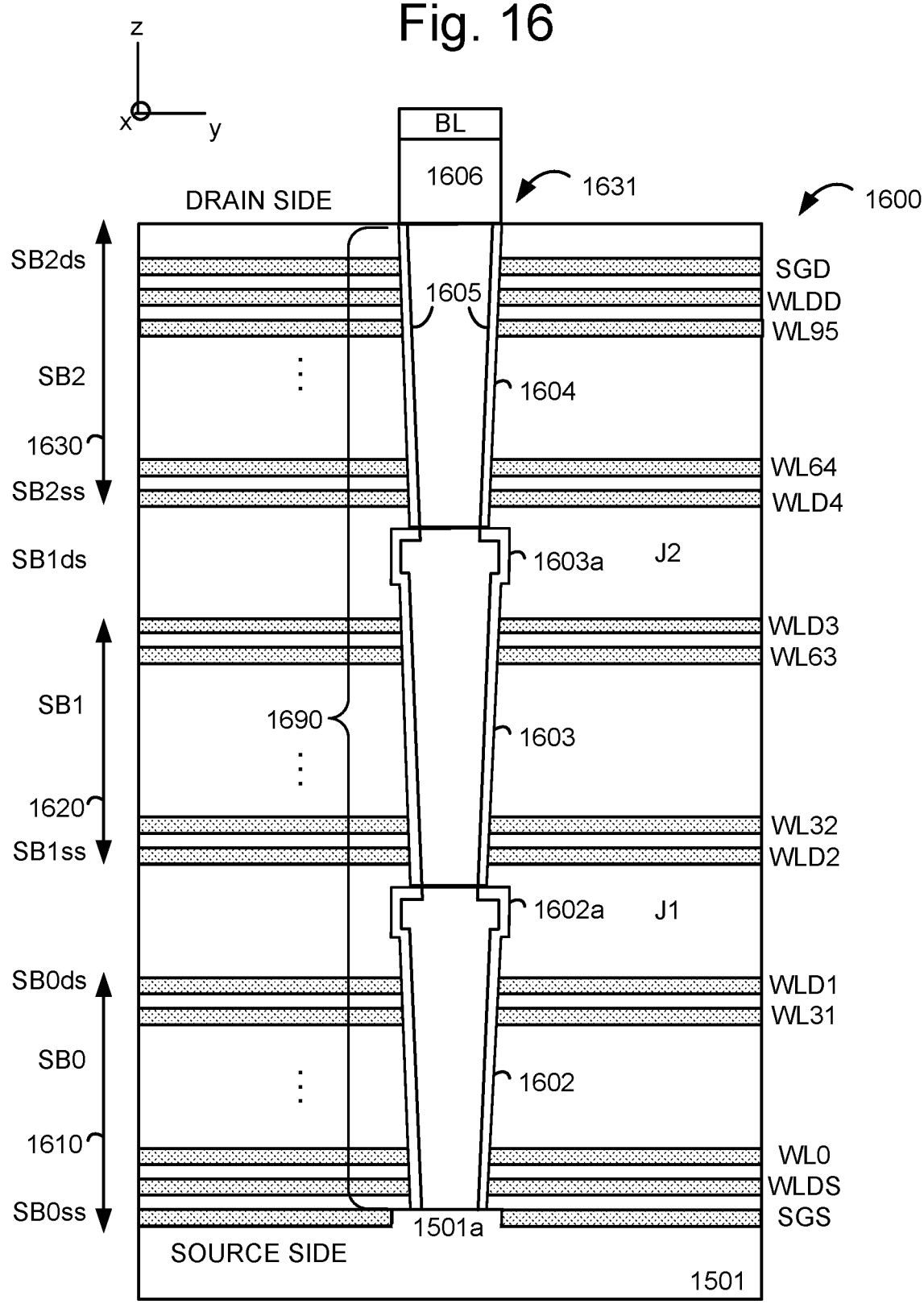
FIG. 16 depicts a portion of a three-tier block 1600 having sub-blocks SB0, SB1 and SB2 in tiers 1610, 1620 and 1630, respectively.
Figure 17:
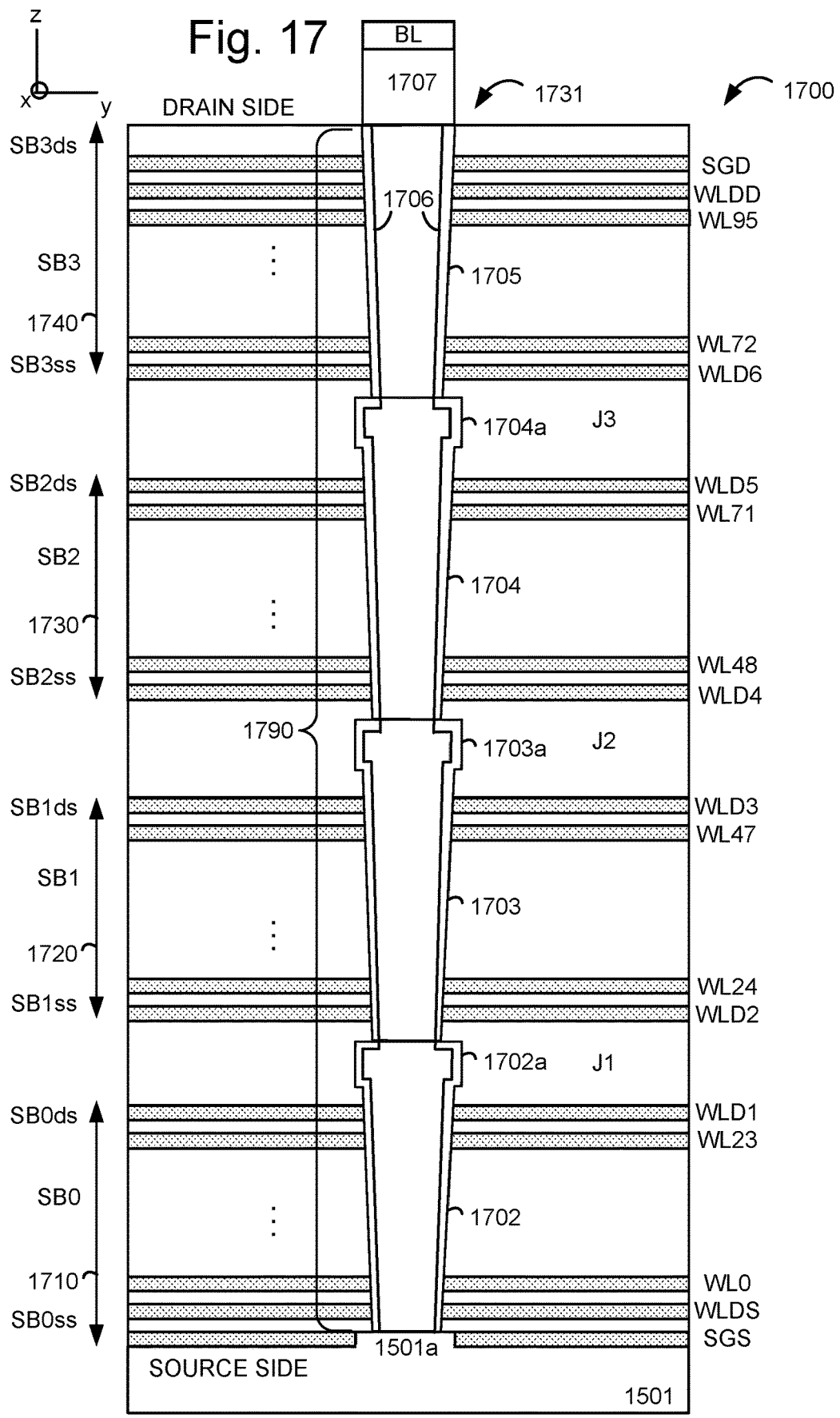
FIG. 17 depicts a portion of a four-tier block 1700 having sub-blocks SB0, SB1, SB2 and SB3 in tiers 1710, 1720, 1730 and 1740, respectively.

FIG. 15 depicts a portion of a two-tier block 1500 having sub-blocks SB0 and SB1 in tiers 1510 and 1520, respectively. As mentioned, a tier refers to a section of a block which is fabricated with a respective portion of a memory hole. The block is formed on a substrate 1501 and includes a first tier 1510 at a source side of the block and a second tier 1520, atop the first tier, at a drain side of the block. In FIG. 15-17, the notation "DRAIN SIDE" refers to the drain side of the NAND string and the drain side of the block, and the notation "SOURCE SIDE" refers to the source side of the NAND string and the source side of the block.

A source-side sub-block SB0 is provided by the memory cells in the first tier and extends from a source side SB0ss to a drain-side SB0ds. These memory cells are connected to word lines WL0-WL47 representing one-half of the word lines in the block. The SGS and WLDS layers are also in SB0. A drain-side sub-block, SB1, is provided by the memory cells in the second tier and extends from a source side SB1ss to a drain-side SB1ds. These memory cells are connected to word lines WL48-WL95 representing another one-half of the word lines in the block. The SGD and WLDD layers are also in SB1.

A NAND string 1531 extends in a memory hole 1590 which comprises memory hole portions 1502 and 1503 in the tiers 1510 and 1520, respectively. Due to the etching process, the memory hole portion 1502 is wider at the top than at the bottom. Additionally, a further widened region 1502a is formed at the top of the memory hole portion 1502 to provide a surface for aligning with the bottom of the memory hole portion 1503. There is a step change in the width of the memory hole portion 1502 from w1 to w2 at the further widened region 1502a. Similarly, the memory hole portion 1503 is wider at the top than at the bottom. The top of the memory hole portion 1503 is connected to a bit line BL by a via 1505.

A junction J1 comprising dielectric material is formed between the tiers and includes the widened region 1502a. Dummy word lines WLD1 and WLD2 are formed in the tiers below and above, respectively, the junction. It is difficult to program the memory cells connected to the dummy word lines due to the height of the junction (h1), which can be greater than at least 1.5 times a height (h2) of each of the dielectric layers. Because of this height, these memory cells receive a reduced fringing electric field. As a result, these junction-adjacent word lines are typically classified as dummy word lines in which user data is not stored. The additional height is needed to provide room for the widened region 1502a and the interface to the bottom of the tier 1520.

In an example implementation, each sub-block of a block comprises alternating conductive and dielectric layers, adjacent sub-blocks of the plurality of sub-blocks are separated by a junction, and a height of the junction is greater than at least 1.5 times a height of each of the dielectric layers. For example, in FIG. 15-17, adjacent sub-blocks SB0 and SB1 are separated by a junction J1. In FIGS. 16 and 17, adjacent sub-blocks SB1 and SB2 are separated by a junction J2. In FIG. 17, adjacent sub-blocks SB2 and SB3 are separated by a junction J3.

During fabrication, the layers of the tier 1510 are formed first, followed by the junction J1. The memory hole portion 1502 is then etched in the junction and the tier, down to the epitaxial region 1501a of the substrate 1501. A further etching is performed in the junction to provide the widened region 1502a, and a sacrificial material is deposited in the memory hole portion 1502. The layers of the tier 1520 are then formed above the junction and the memory hole portion 1503 is etched in the tier, down to the sacrificial material of the widened region 1502a. A further etching is performed to remove the sacrificial material so that a continuous memory hole 1590 is formed from the drain side to the source side of the block. Successive layers of materials such as the blocking oxide layer, charge trapping layer, tunneling layer and the channel layer 1504 can then be deposited in the memory hole 1590. A dielectric core filler is then deposited, after which the via 1505 is formed.

FIG. 16 depicts a portion of a three-tier block 1600 having sub-blocks SB0, SB1 and SB2 in tiers 1610, 1620 and 1630, respectively. The block is formed on the substrate 1501 and includes a first tier 1610 at a source side of the block, a second tier 1620, atop the first tier, and a third tier 1630, atop the second tier, at a drain side of the block. A source-side sub-block SB0 is provided by the memory cells in the first tier and extends from a source side SB0ss to a drain-side SB0ds. These memory cells are connected to word lines WL0-WL31, representing one-third of the word lines in the block. The SGS and WLDS layers are also in SB0. An interior sub-block SB1 is provided by the memory cells in the second tier and extends from a source side SB1ss to a drain side SB1ds. These memory cells are connected to word lines WL32-WL63, representing another one-third of the word lines in the block. A drain-side side sub-block SB2 is provided by the memory cells in the third tier and extends from a source side SB2ss to a drain-side SB2ds. These memory cells are connected to word lines WL64-WL95 representing a final one-third of the word lines in the block. The SGD and WLDD layers are also in SB2.

A NAND string 1631 extends in a memory hole 1690 which comprises memory hole portions 1602, 1603 and 1604 in the tiers 1610, 1620 and 1630, respectively. The memory hole portion 1602 is wider at the top than at the bottom. Additionally, a further widened region 1602a is formed at the top of the memory hole portion 1602 to provide a surface for aligning with the bottom of the memory hole portion 1603.

The memory hole portion 1603 is wider at the top than at the bottom. Additionally, a further widened region 1603a is formed at the top of the memory hole portion 1603 to provide a surface for aligning with the bottom of the memory hole portion 1604. Similarly, the memory hole portion 1604 is wider at the top than at the bottom. The top of the memory hole portion 1604 is connected to a bit line BL by a via 1606.

A junction J1 is formed between the tiers 1610 and 1620, and a junction J2 is formed between the tiers 1620 and 1630. Dummy word lines WLD1 and WLD2 are formed in the tiers below and above, respectively, J1, and dummy word lines WLD3 and WLD4 are formed in the tiers below and above, respectively, J2.

The fabrication proceeds in a similar way as discussed in connection with FIG. 15 to form the continuous memory hole 1690. Successive layers of materials including the channel layer 1605 are deposited in the memory hole 1690. A dielectric core filler is then deposited, after which the via 1606 is formed.

FIG. 17 depicts a portion of a four-tier block 1700 having sub-blocks SB0, SB1, SB2 and SB3 in tiers 1710, 1720, 1730 and 1740, respectively. The block is formed on the substrate 1501 and includes a first tier 1710 at a source side of the block, a second tier 1720, atop the first tier, a third tier 1730, atop the second tier, and a fourth tier 1740 atop the third tier, at a drain side of the block. A source-side sub-block SB0 is provided by the memory cells in the first tier and extends from a source side SB0ss to a drain side SB0ds. These memory cells are connected to word lines WL0-WL23, representing one-fourth of the word lines in the block. The SGS and WLDS layers are also in SB0. An interior sub-block SB1 is provided by the memory cells in the second tier and extends from a source side SB1ss to a drain side SB1ds. These memory cells are connected to word lines WL24-WL47, representing another one-fourth of the word lines in the block. Another interior sub-block SB2 is provided by the memory cells in the third tier and extends from a source side SB2ss to a drain side SB2ds. These memory cells are connected to word lines WL48-WL71, representing another one-fourth of the word lines in the block. A drain-side sub-block SB3 is provided by the memory cells in the fourth tier and extends from a source side SB3ss to a drain side SB3ds. These memory cells are connected to word lines WL72-WL95, representing a final one-fourth of the word lines in the block. The SGD and WLDD layers are also in SB3.

A NAND string 1731 extends in a memory hole 1790 which comprises memory hole portions 1702, 1703, 1704 and 1705 in the tiers 1710, 1720, 1730 and 1740, respectively. Due to the etching process, the memory hole portion 1702 is wider at the top than at the bottom. Additionally, a further widened region 1702a is formed at the top of the memory hole portion 1702 to provide a surface for aligning with the bottom of the memory hole portion 1703.

The memory hole portion 1703 is wider at the top than at the bottom. Additionally, a further widened region 1703a is formed at the top of the memory hole portion 1703 to provide a surface for aligning with the bottom of the memory hole portion 1704. The memory hole portion 1704 is wider at the top than at the bottom. Additionally, a further widened region 1704a is formed at the top of the memory hole portion 1704 to provide a surface for aligning with the bottom of the memory hole portion 1705. Similarly, the memory hole portion 1705 is wider at the top than at the bottom. The top of the memory hole portion 1705 is connected to a bit line BL by a via 1707.

A junction J1 is formed between the tiers 1710 and 1720, a junction J2 is formed between the tiers 1720 and 1730, and a junction J3 is formed between the tiers 1730 and 1740. Dummy word lines WLD1 and WLD2 are formed in the tiers below and above, respectively, J1, dummy word lines WLD3 and WLD4 are formed in the tiers below and above, respectively, J2, and dummy word lines WLDS and WLD6 are formed in the tiers below and above, respectively, J3.

The fabrication proceeds in a similar way as discussed in connection with FIG. 15 to form the continuous memory hole 1790. Successive layers of materials including the channel layer 1706 are deposited in the memory hole 1790. A dielectric core filler is then deposited, after which the via 1707 is formed.

More than four tiers could be provided in a block as well. Additionally, while each tier comprises an equal number of data word lines in FIG. 15-17, it is possible to provide equal numbers of data word lines in the different tiers.

Figure 18A:
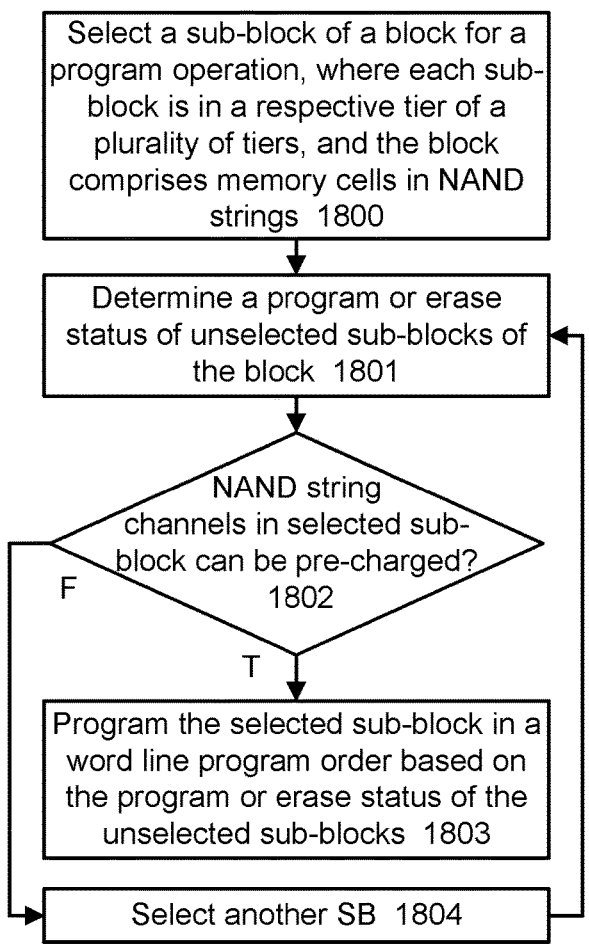
FIG. 18A depicts a flowchart of a process for programming a selected sub-block of a block based on the program or erase status of the unselected sub-blocks in the block.

FIG. 18A depicts a flowchart of a process for programming a selected sub-block of a block based on the program or erase status of the unselected sub-blocks in the block. Step 1800 includes selecting a sub-block of a block for a program operation, where each sub-block is in a respective tier of a plurality of tiers of a block, such as depicted in FIG. 15-17. Step 1801 includes determining a program or erase status of unselected sub-blocks of the block. A decision step 1802 determines whether the NAND string channels in the selected sub-block can be pre-charged, e.g., whether there is a path from a portion of the NAND string channels in the selected sub-block to either the source- or drain-side of the block which is not blocked by a programmed sub-block. If the decision step is true, step 1803 includes programming the selected sub-block in a word line program order based on the program or erase status of the unselected sub-blocks.

For example, the word line program order can be from the source side to the drain side of the sub-block, or from the drain side to the source side of the sub-block. In FIG. 16, for example, in SB1, the word line program order can be from the source-side SB1ss (WL32) to the drain-side SB1ds (WL63), e.g., WL32, WL33, . . . , WL63, or from the drain side (WL63) to the source side (WL32), e.g., WL63, WL62, . . . , WL32.

If the decision step 1802 is false, step 1804 includes selecting another sub-block to be programmed, e.g., in the same block or another block, and step 1801 is repeated.

Figure 18B:
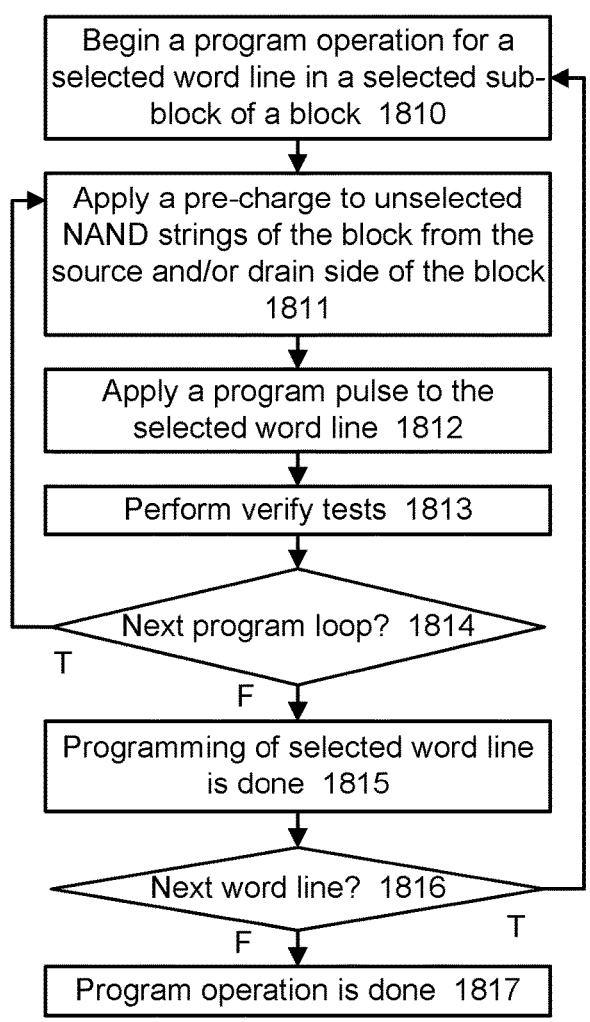
FIG. 18B depicts a flowchart of a program operation consistent with FIG. 18A, step 1803.

FIG. 18B depicts a flowchart of a program operation consistent with FIG. 18A, step 1803. Step 1810 begins a program operation for a selected word line in a selected sub-block of a block. For example, an edge word line of the selected block can be programmed first. In FIG. 16, for example, in SB1, WL32 is the source-side edge word line and WL63 is the drain-side edge word line. WL32 is programmed first when SB1 is programmed from the source side to the drain side, and WL63 is programmed first when SB1 is programmed from the drain side to the source side. Step 1811 applies a pre-charge to unselected NAND strings of the block from the source and/or drain side of the block. The pre-charge can be applied at the source side using Vsrc or at the drain side using Vbl such as discussed in connection with FIGS. 12 and 13 for SLC or MLC programming, respectively. The user data latches of FIG. 2 can be configured for each NAND string to identify whether the NAND string is selected or unselected.

Step 1812 applies a program pulse to the selected word line and step 1813 includes performing one or more verify tests, such as discussed in connection with FIGS. 9 and 12 for SLC programming, or FIGS. 11 and 13 for MLC programming. A decision step 1814 determines whether there is a next program loop in the program operation. This is true if the program operation is not yet completed. If the decision step 1814 is true, step 1811 is repeated in a next program loop. If the decision step 1814 is false, the programming of the selected word line is done at step 1815. A decision step 1816 determines whether there is a next word line to program in the sub-block. If the decision step 1816 is true, the process is repeated starting at step 1810 for the next selected word line. If the decision step 1816 is false, the program operation is done at step 1817.

Figure 18C:
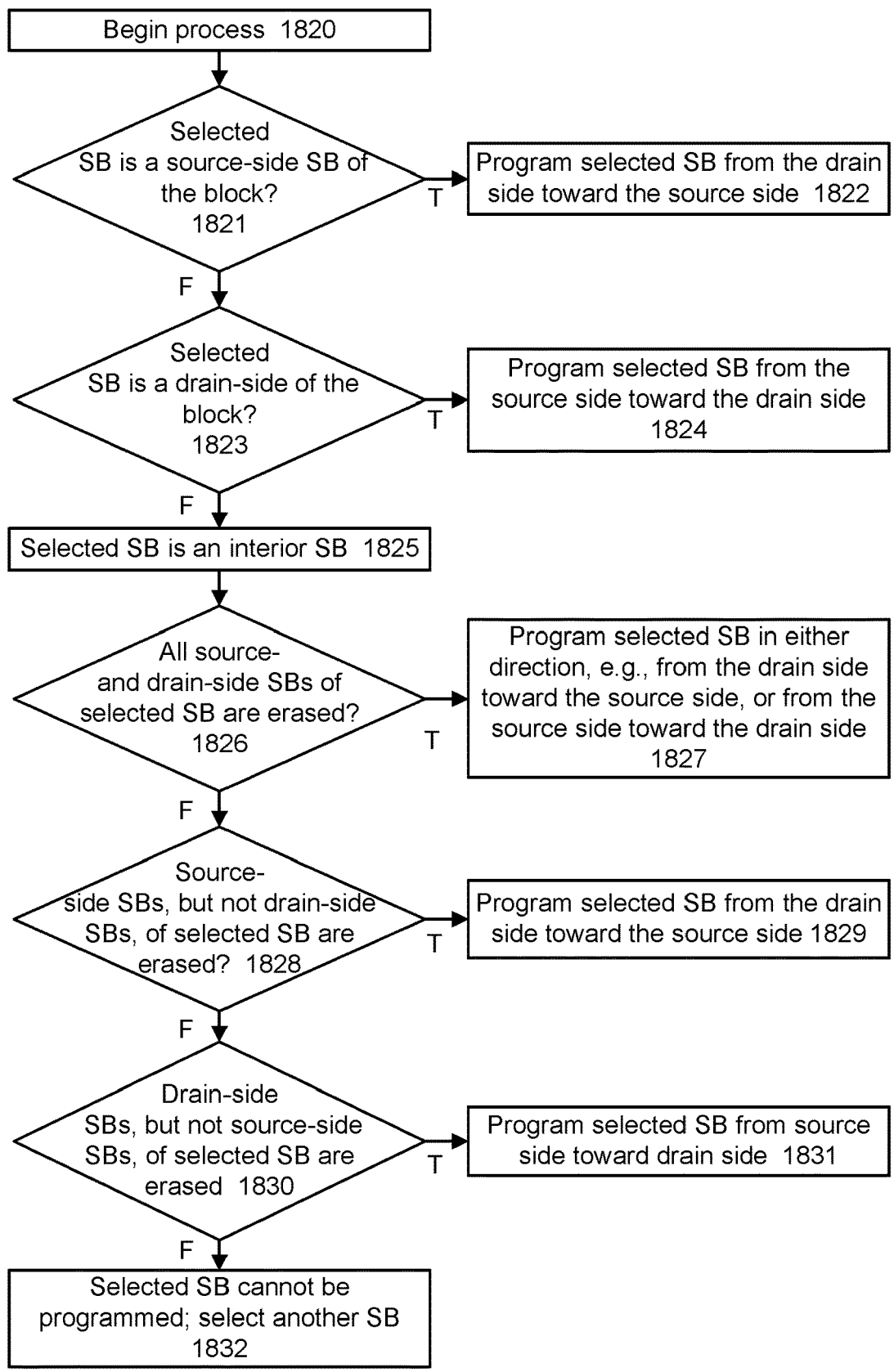
FIG. 18C depicts a flowchart of a process consistent with FIG. 18A, steps 1802-1804.

FIG. 18C depicts a flowchart of a process consistent with FIG. 18A, steps 1802-1804. Step 1820 begins the process. A decision step 1821 determines whether the selected sub-block (SB) is a source-side SB of the block. If the decision step 1821 is true, step 1822 includes programming the selected SB from the drain side of the SB toward the source side of the SB. This refers to a word line program order. For example, the source-side SB, SB0, in FIG. 16 has a source side, SB0ss and a drain side, SB0ds. In SB0, WL0 is the data word line adjacent to SB0ss and WL31 is the data word line adjacent to SB0ds. The word line program order is therefore from WL31-WL0, or WL31, WL30, . . . , WL0. In some cases, all word lines in a SB are programmed and in other cases only a portion of the word lines in a SB are programmed.

If the decision step 1821 is false, a decision step 1823 determines whether the selected SB is a drain-side SB of the block. If the decision step 1823 is true, step 1824 includes programming the selected SB from the source side of the SB toward the drain side of the SB. For example, the drain-side SB, SB2, in FIG. 16 has a source side SB2ss and a drain side SB2ds. In SB2, WL64 is the data word line adjacent to SB2ss and WL95 is the data word line adjacent to SB2ds. The word line program order is therefore from WL64-WL95, or WL64, WL65, WL95.

If the decision step 1823 is false, step 1825 indicates that the selected SB is an interior SB. That is, the SB is separated from the source side of the block by at least one other block and separated from the drain side of the block by at least one other block.

A decision step 1826 determines whether all source- and drain-side SBs of the selected interior SB are erased. If the decision step 1826 is true, step 1827 includes programming the selected SB in either direction, e.g., from the drain side of the SB toward the source side of the SB, or from the source side of the SB toward the drain side of the SB. If the decision step 1826 is false, a decision step 1828 determines whether the source-side SBs, but not the drain-side SBs, of the selected SB are erased. These source-side SBs include one or more SBs on the source side of the selected SB. For example, in FIG. 17, SB0 and SB1 are source-side SBs of SB2.

If the decision step 1828 is true, step 1829 programs the selected SB from the drain side of the SB toward the source side of the SB. If the decision step 1828 is false, a decision step 1830 determines whether the drain-side SBs, but not the source-side SBs, of the selected SB are erased. These drain-side SBs include one or more SBs on the drain side of the selected SB. For example, in FIG. 17, SB2 and SB3 are drain-side SBs of SB1. If the decision step 1830 is true, step 1831 programs the selected SB from the source side of the SB toward the drain side of the SB. If the decision step 1830 is false, step 1832 indicates that the selected SB cannot be programmed, and another SB is selected for the programming.

Generally, a sub-block is programmed in a direction toward the side of the sub-block and the block from which the channel pre-charge is provided.

FIG. 18D depicts a flowchart of a process for accessing a table to identify a free block, free sub-blocks and a word line program order, consistent with FIG. 18A. Step 1840 involves accessing a table or other data structure to identify free blocks, free sub-blocks and a word line program order. A free block is a block with one or more free sub-blocks, e.g., blocks that are currently erased and which can be pre-charged for programming. Step 1841 updates the table after programming a sub-block. See FIG. 30A-31D for example tables and updating.

FIG. 18E depicts a flowchart of a process for reading edges word lines of sub-blocks of a block to identify their program or erased status and to determine a programmable sub-block and a word line program order, consistent with FIG. 18A. Step 1850 includes performing read operations to identify free blocks, sub-blocks and a word line program order. Step 1851 includes reading a drain-side SB of a block at a source-side edge word line (WL) to determine if the SB is programmed. A programmed SB is one which has programmed memory cells on one or more word lines. An example of a source-side edge WL in a drain-side SB is WL64 in SB2 adjacent to J2 in FIG. 16, or WL72 in SB3 adjacent to J3 in FIG. 17. If the reading indicates the presence of programmed memory cells on the source-side edge word line, the entire sub-block is considered to be programmed. If the reading does not indicate the presence of any programmed memory cells on the edge word line, the entire sub-block is considered to be erased. An erased SB is one in which all memory cells are erased. For a sub-block in a MLC mode, the read operation can involve any of the read voltages of FIG. 10, for example, or another voltage. For a sub-block in the SLC mode, the read operation can involve the read voltage Vr_slc of FIG. 8 or another voltage. Generally, different sub-blocks can be programmed with a different number of bits per cell.

The read operation is referred to as an FF read since it determines whether the memory cells are all in the erased state, which corresponds to a string of binary 1's.

When reading the memory cells connected to a word line to determine if the associated SB is programmed, it is typically sufficient to read only a portion of the memory cells connected to the word line. The portion can include memory cells in a single NAND string groups (NSG) of the sub-block, for example. This can save time. Generally, the time cost of the read operation is relatively small.

In an example implementation, the memory cells of the block are arranged in a plurality of NAND string groups, and the memory cells which are read to determine the program or erase status of an unselected sub-block are in a single NAND string group of the plurality of NAND string groups.

Step 1852 includes reading a source-side SB of a block at a drain-side edge WL to determine if the SB is programmed. An example of a drain-side edge WL in a source-side SB is WL31 in SB0 adjacent to J1 in FIG. 16, or WL23 in SB0 adjacent to J1 in FIG. 17.

A decision step 1853 determines whether the drain- and source-side SBs are both programmed. With decision step 1853, the subsequent reading of the one or more interior SBs in step 1855 can be omitted if the source- and drain-side SBs are both programmed. If the source- and drain-side SBs are both programmed, step 1854 indicates there are no free SBs in the block. If the source- and drain-side SBs are not both programmed, step 1855 includes reading an interior SB at both edge WLs to determine if the SB is programmed. An interior SB is between the source- and drain-side SBs.

Examples of edge WLs in an interior SB are the source-side edge word line WL32 and the drain-side edge word line WL63 in SB1 in FIG. 16. In FIG. 17, examples of edge WLs in an interior SB are the source-side edge word line WL24 and the drain-side edge word line WL47 in SB1, and the source-side edge word line WL48 and the drain-side edge word line WL71 in SB2. An edge word line can be the first or last data word line in a sub-block.

If one or both edge word lines have programmed memory cells, the entire sub-block is considered to be programmed. In one approach, if the edge word line which is read first in a SB has programmed memory cells, the reading of the other edge word line is omitted to save time and it is concluded that the sub-block is programmed.

A decision step 1856 determines whether there is a next interior SB to read. If the decision step is true, step 1855 is repeated for the next SB. If the decision step 1856 is false, step 1857 determines the free SBs of the block and a program order for each free SB based on the results of the read operations and the techniques discussed herein.

FIG. 18F depicts a flowchart of a process for erasing sub-blocks of memory cells, reserving a source-side sub-block for programming in an N1 bit per cell mode and reserving a drain-side sub-block for programming in an N2>N1 bit per cell mode.

The erase of the bottom, source-side SB of a block (e.g., SB0 in FIG. 15-17) involves injecting holes into the NAND string channels via the substrate, while the erase of the top, drain-side SB (e.g., SB1 in FIG. 15, SB2 in FIG. 16 or SB3 in FIG. 17) involves injecting holes into the NAND string channels via the SGD transistor. The injection via the substrate tends to be stronger due to the large supply of holes in the p-well, so that the holes will migrate easily throughout the NAND string channels, including to the far end of the channel adjacent to the drain-side sub-block. Therefore, when the source-side SB is being erased, the drain-side SB will have a relatively high channel voltage, and a relatively low gate-to-channel voltage. The drain-side SB will therefore be less likely to have erase disturb. Erase disturb refers to an increase in the upper tail of the Vth distribution when memory cells in an unselected sub-block are inadvertently programmed in an erase operation for a selected sub-block in the same block. The inadvertent programming is caused by the relatively high inhibit voltage on the word lines.

In contrast, when the drain-side SB is being erased, the number of holes generated from the SGD transistors is less than the number of holes which can be supplied from the p-well, so that the holes cannot migrate as easily throughout the NAND string channels to the far end of the channel adjacent to the source-side sub-block. The source-side SB will therefore have a relatively low channel voltage, and a relatively high gate-to-channel voltage. The source-side SB will therefore be more likely to have erase disturb. The source-side SB can therefore be used for SLC cells, where there is a relatively larger margin for disturbs, while the drain-side SB can be used for MLC cells, where there is a relatively small margin for disturbs.

Another option is to have the number of bits per cell increase as a function of the height of the SB above the substrate. That is, the number of bits per cell is an increasing function of the height. For example, in a two-tier block, the source-side SB can have N1 bits per cell (e.g., one bit per cell), and the drain-side SB can have N2>N1 bits per cell, where N1 and N2 are positive integers. In a three-tier block, the source-side SB can have N1 bits per cell, the interior SB can have N2>N1 bits per cell and the drain-side SB can have N3>N2 bits per cell, where N1, N2 and N3 are positive integers. In a four-tier block, the source-side SB can have N1 bits per cell, the two interior SBs can have N2>N1 bits per cell and the drain-side SB can have N3>N2 bits per cell, where N1, N2 and N3 are positive integers. Other variations are possible as well.

In another implementation a control circuit is configured to program the selected sub-block in an N1 bit per cell mode when the selected sub-block is a source-side sub-block which is adjacent to the substrate, and to program the selected sub-block in an N2>N1 bit per cell mode when the selected sub-block is non-adjacent to the substrate.

In another implementation a control circuit is configured to reserve the source-side sub-block for programming in an N1 bit per cell mode; and to reserve the drain-side sub-block for programming in an N2>N1 bit per cell mode. Additionally, the block can have an interior sub-block between the drain-side sub-block and the source-side sub-block, where the control circuit is configured to reserve the interior sub-block for programming in an N3 bit per cell mode, where N2>N3>N1. In this approach, the number of bits per cell is lowest at the source-side SB, at an intermediate level in the interior SB and highest at a drain-side SB.

In an example process, step 1860 includes erasing memory cells in a drain-side sub-block by charging up channels of the NAND strings from the drain side of the block while inhibiting erase of memory cells in the source-side sub-block. Step 1861 includes erasing memory cells in the source-side sub-block by charging up the channels of the NAND strings from the source side of the block while inhibiting erase of memory cells in the drain-side sub-block. See FIG. 14 for example voltage signals used in an erase operation. Vwl_en is used to enable erase in a selected sub-block and Vwl_inh is used to inhibit erase in an unselected sub-block.

Step 1862 includes reserving the source-side sub-block for programming in an N1 bit per cell (e.g., SLC) mode, and step 1863 includes reserving the drain-side sub-block for programming in an N2>N1 bit per cell (e.g., MLC) mode.

In one approach, a control circuit, to charge up the channels of the NAND strings from the drain side of the block, is configured to bias drain side select gate transistors of the NAND strings for gate-induce drain leakage; and to charge up the channels of the NAND strings from the source side of the block, is configured to apply an erase voltage to a substrate on which the block is formed.

The block can be rated for use in a specified number of program-erase cycles in its lifetime, and the erasing of the memory cells in the drain-side sub-block, the erasing of the memory cells in the source-side sub-block, the reserving of the source-side sub-block for programming in the N1 bit per cell mode, and the reserving of the drain-side sub-block for programming in the N2>N1 bit per cell mode can occur in all, or at least a majority, of the specified number of program-erase cycles in the lifetime of the block. Thus, the majority of the program-erase cycles of a block can follow the process of FIG. 18F.

The N1 bit per cell mode can be a single bit per cell mode, and the N2>N1 bit per cell mode can be a multiple bit per cell mode.

FIG. 19-29 depict various configurations of sub-blocks in a block. NSG0-NSG4 refer to NAND string groups such as depicted in FIG. 7A. Each NAND string group comprises NAND strings which extend the full height of the block.

FIG. 19 depicts example word line program orders for a block with two sub-blocks, consistent with FIGS. 15 and 18A-18C. Initially, SB0 and SB1 are erased. Since both sub-blocks are edge sub-blocks, where SB0 is the source-side SB and SB1 is the drain-side SB, they can be programmed without the concern of whether there is a pre-charge path. Specifically, SB0 can be programmed with a pre-charge from the source side of the block, with a word line program order depicted by the arrow 1901, from the junction J1 to the source-side of the block. SB1 can be programmed with a pre-charge from the drain side of the block, with a word line program order depicted by the arrow 1902, from J1 to the drain-side of the block. SB0 can be programmed before SB1, or SB1 can be programmed before SB0.

Note that a sub-block can be programmed partially or completely before programming another sub-block. Partial programming refers to programming memory cells connected to fewer than all data word lines of the sub-block. Complete programming refers to programming memory cells connected to all data word lines of the sub-block.

FIG. 20 depicts example word line program orders for a block with three sub-blocks, consistent with FIGS. 16 and 18A-18C. Initially, SB0-SB2 are erased. As in FIG. 19, the edge sub-blocks can be programmed without the concern of whether there is a pre-charge path. Specifically, SB0 can be programmed with a pre-charge from the source side of the block, with a word line program order depicted by the arrow 2001 from J1 to the source-side of the block, and SB2 can be programmed with a pre-charge from the drain side of the block, with a word line program order depicted by the arrow 2003 from J2 to the drain-side of the block. For the interior sub-block SB1 to be programmed, it must have a pre-charge path to the source side of the block through SB0, e.g., SB0 must be erased, or to the drain side of the block through SB2, e.g., SB2 must be erased.

For the above reasons, it is advantageous for the interior sub-block to be the first-programmed sub-block of the block. In this case, the word line program order can be in either direction as depicted by the arrow 2002, e.g., from J1 to J2 (toward the drain side of the block or sub-block), or from J2 to J1 (toward the source side of the block or sub-block).

In FIGS. 21, 22, and 24-27, the circled numbers of the arrows denote a sub-block programming order.

FIG. 21 depicts an example program order consistent with FIG. 20, where SB0 is programmed toward the source side of the block, then SB1 is programmed toward the drain side of the block, then SB2 is programmed toward the drain side of the block. Initially, SB0-SB2 are erased. The arrow 2101 and the circled "1" indicate SB0 is programmed first, with a WL program order toward the source side of the block. The arrow 2102 and the circled "2" indicate SB1 is programmed second, with a WL program order toward the drain side of the block. The arrow 2103 and the circled "3" indicate SB2 is programmed third and last, with a WL program order toward the drain side of the block. The sub-block program order seeks to provide a pre-charge path for an interior sub-block through an erased source-side or drain-side sub-block. Additionally, the source-side and drain-side sub-blocks are pre-charged via the source-side or drain side of the block, respectively, as this is the closest point at which the pre-charge voltage is applied.

In this example, once SB0 is programmed, the only path for pre-charging is toward the drain side of the block, so that the remaining sub-blocks have a WL program order toward the drain side of the block.

FIG. 22 depicts an example program order consistent with FIG. 20, where SB2 is programmed toward the drain side of the block, then SB1 is programmed toward the source side of the block, then SB0 is programmed toward the source side of the block. This is an option to the sub-block program order of FIG. 21. Initially, SB0-SB2 are erased. The arrow 2201 and the circled "1" indicate SB2 is programmed first, with a WL program order toward the drain side of the block. The arrow 2202 and the circled "2" indicate SB1 is programmed second, with a WL program order toward the source side of the block. The arrow 2203 and the circled "3" indicate SB0 is programmed third and last, with a WL program order toward the source side of the block.

In this example, once SB2 is programmed, the only path for pre-charging is toward the source side of the block, so that the remaining sub-blocks have a WL program order toward the source side of the block.

Figure 23:
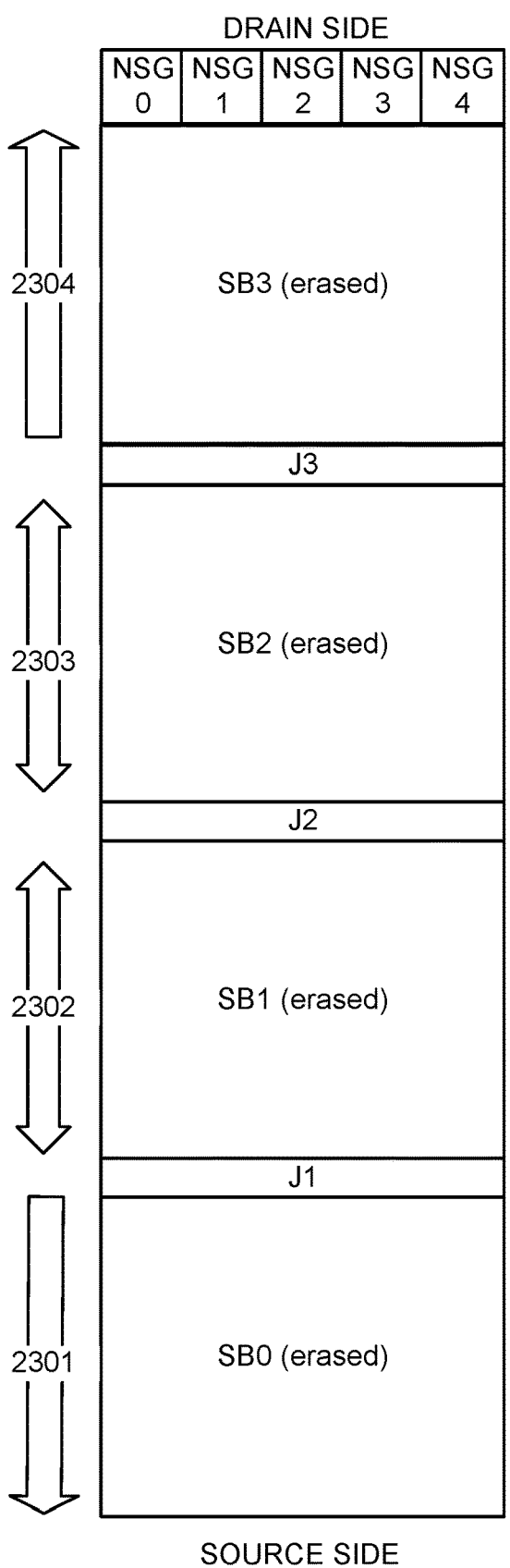
FIG. 23 depicts example word line program orders for a block with four sub-blocks, consistent with FIGS. 17 and 18A-18C.

FIG. 23 depicts example word line program orders for a block with four sub-blocks, consistent with FIGS. 17 and 18A-18C. When there are four sub-blocks in a block, there are two interior sub-blocks, SB1 and SB2 so that the concern for providing a pre-charge path for the interior sub-blocks is increased. Initially, SB0-SB3 are erased. The arrow 2301 indicates the source-side sub-block SB0 can be programmed with a WL program order toward the source side of the block. The arrows 2302 and 2303 indicate the interior sub-blocks SB1 and SB2, respectively, can be programmed with a WL program order toward the source or drain side of the block, depending on which direction provides a pre-charge path. The arrow 2304 indicates the drain-side sub-block SB3 can be programmed with a WL program order toward the drain side of the block.

Figure 24:
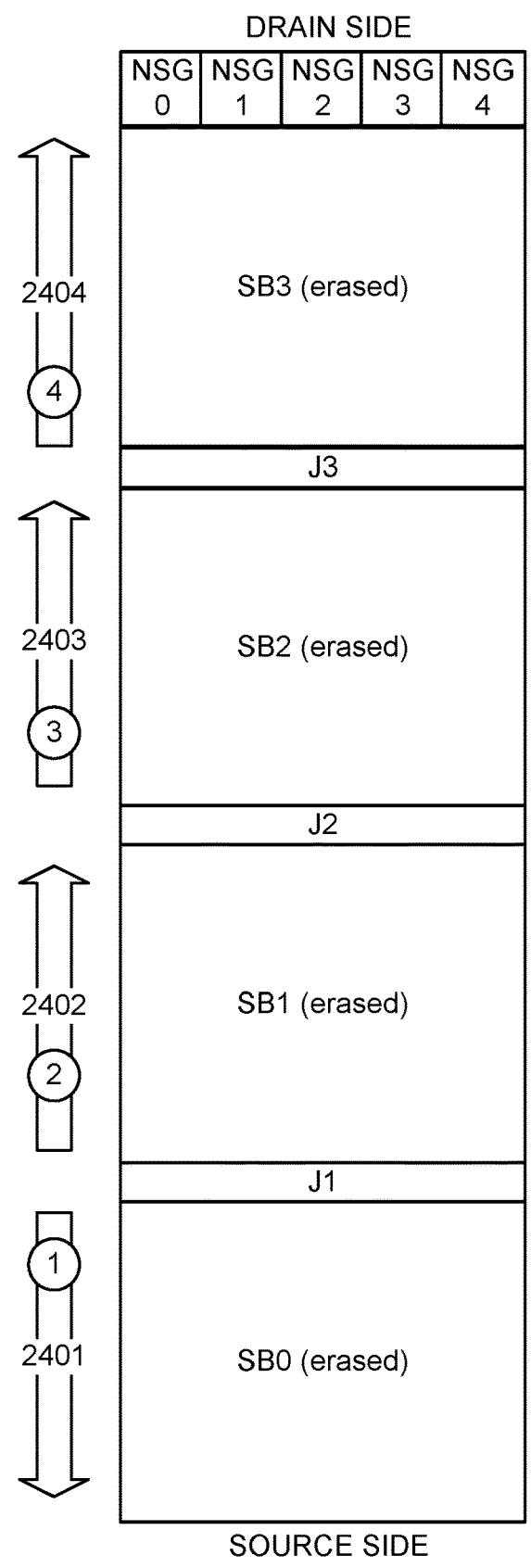
FIG. 24 depicts an example program order consistent with FIG. 23, where SB0 is programmed toward the source side of the block, then SB1 is programmed toward the drain side of the block, then SB2 is programmed toward the drain side of the block, then SB3 is programmed toward the drain side of the block.

FIG. 24 depicts an example program order consistent with FIG. 23, where SB0 is programmed toward the source side of the block, then SB1 is programmed toward the drain side of the block, then SB2 is programmed toward the drain side of the block, then SB3 is programmed toward the drain side of the block. Initially, SB0-SB3 are erased. The arrow 2401 and the circled "1" indicate SB0 is programmed first, with a WL program order toward the source side of the block. The arrow 2402 and the circled "2" indicate SB1 is programmed second, with a WL program order toward the drain side of the block. The arrow 2403 and the circled "3" indicate SB2 is programmed third, with a WL program order toward the drain side of the block. The arrow 2404 and the circled "4" indicate SB3 is programmed fourth and last, with a WL program order toward the drain side of the block.

In this example, once SB0 is programmed, the only path for pre-charging is toward the drain side of the block, so that the remaining sub-blocks have a WL program order toward the drain side of the block.

FIG. 25 depicts an example program order consistent with FIG. 23, where SB1 is programmed toward the source side of the block, then SB0 is programmed toward the source side of the block, then SB2 is programmed toward the drain side of the block, then SB3 is programmed toward the drain side of the block. Initially, SB0-SB3 are erased. The arrow 2501 and the circled "1" indicate SB1 is programmed first, with a WL program order toward the source side of the block. The arrow 2502 and the circled "2" indicate SB0 is programmed second, with a WL program order toward the source side of the block. The arrow 2503 and the circled "3" indicate SB2 is programmed third, with a WL program order toward the drain side of the block. The arrow 2504 and the circled "4" indicate SB3 is programmed fourth and last, with a WL program order toward the drain side of the block.

FIG. 26 depicts an example program order consistent with FIG. 23, where SB3 is programmed toward the drain side of the block, then SB2 is programmed toward the source side of the block, then SB1 is programmed toward the source side of the block, then SB0 is programmed toward the source side of the block. Initially, SB0-SB3 are erased. The arrow 2601 and the circled "1" indicate SB3 is programmed first, with a WL program order toward the drain side of the block. The arrow 2602 and the circled "2" indicate SB2 is programmed second, with a WL program order toward the source side of the block. The arrow 2603 and the circled "3" indicate SB1 is programmed third, with a WL program order toward the source side of the block. The arrow 2604 and the circled "4" indicate SB0 is programmed fourth and last, with a WL program order toward the source side of the block.

Figure 27:
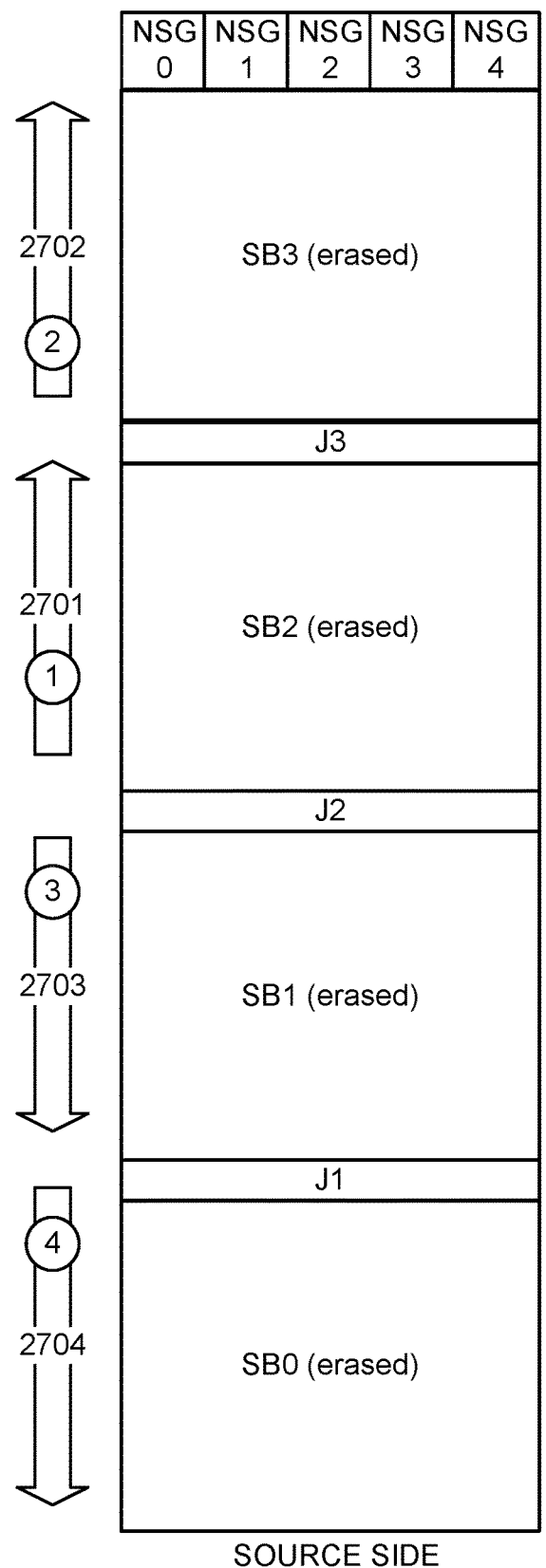
FIG. 27 depicts an example program order consistent with FIG. 23, where SB2 is programmed toward the drain side of the block, then SB3 is programmed toward the drain side of the block, then SB1 is programmed toward the source side of the block, then SB0 is programmed toward the source side of the block.

FIG. 27 depicts an example program order consistent with FIG. 23, where SB2 is programmed toward the drain side of the block, then SB3 is programmed toward the drain side of the block, then SB1 is programmed toward the source side of the block, then SB0 is programmed toward the source side of the block. Initially, SB0-SB3 are erased. The arrow 2701 and the circled "1" indicate SB2 is programmed first, with a WL program order toward the drain side of the block. The arrow 2702 and the circled "2" indicate SB3 is programmed second, with a WL program order toward the drain side of the block. The arrow 2703 and the circled "3" indicate SB1 is programmed third, with a WL program order toward the source side of the block. The arrow 2704 and the circled "4" indicate SB0 is programmed fourth and last, with a WL program order toward the source side of the block.

FIG. 28 depicts an example arrangement of sub-blocks consistent with FIG. 17 where an interior sub-block SB1 cannot be programmed. When SB0 is programmed, there is no pre-charge path from SB1 to the source side of the block, and when SB2 is programmed, there is no pre-charge path from SB1 to the drain side of the block. The "X" indicates SB1 cannot be programmed. The arrow 2801 indicates SB3 can be programmed with a WL direction toward the drain side of the block.

FIG. 29 depicts an example arrangement of sub-blocks consistent with FIG. 17 where interior sub-blocks SB1 and SB2 cannot be programmed. When SB0 is programmed, there is no pre-charge path from SB1 or SB2 to the source side of the block, and when SB3 is programmed, there is no pre-charge path from SB1 or SB2 to the drain side of the block. The "X" indicates SB1 and SB2 cannot be programmed.

FIGS. 28 and 29 indicate how a sub-block can be precluded from programming, resulting in a reduced storage capacity, if the sub-block programming order is not properly managed.

FIG. 30A depicts an example configuration of a table consistent with FIGS. 18D and 24 in an initial configuration. The table identifies one or more free blocks, free sub-blocks (SBs) in the free blocks, a WL program (pgm.) direction and a next SB to program (e.g., a marker to a next SB to program). As an example, B0-0 is a free block and SB0-SB3 are initially free sub-blocks of the block. The first row of the table indicates SB0 is the current sub-block to program, that SB0 is to be programmed with a WL program direction toward the source side of the block, and SB1 is the next sub-block to program. The second row indicates SB1 is to be programmed with a WL program direction toward the drain side of the block, and SB2 is the next sub-block to program. The third row indicates SB2 is to be programmed with a WL program direction toward the drain side of the block, and SB3 is the next sub-block to program. The fourth row indicates SB3 is to be programmed with a WL program direction toward the drain side of the block, and there is not a next sub-block to program.

FIG. 30B depicts an example configuration of the table of FIG. 30A after SB0 is programmed. The first row of the table indicates SB1 is the current sub-block to program, that SB1 is to be programmed with a WL program direction toward the drain side of the block, and SB2 is the next sub-block to program. The second row indicates SB2 is to be programmed with a WL program direction toward the drain side of the block, and SB3 is the next sub-block to program. The third row indicates SB3 is to be programmed with a WL program direction toward the drain side of the block, and there is not a next sub-block to program.

FIG. 30C depicts an example configuration of the table of FIG. 30B after SB1 is programmed. The first row of the table indicates SB2 is the current sub-block to program, that SB2 is to be programmed with a WL program direction toward the drain side of the block, and SB3 is the next sub-block to program. The second row indicates SB3 is to be programmed with a WL program direction toward the drain side of the block, and there is not a next sub-block to program.

FIG. 30D depicts an example configuration of the table of FIG. 30C after SB2 is programmed. The row of the table indicates SB3 is to be programmed with a WL program direction toward the drain side of the block, and there is no next sub-block to program.

The table is thus updated after each sub-block is programmed to identify the next sub-block to be programmed. In one option, the next sub-block to program is not identified in a separate column of the table but is inferred from the order in which the sub-blocks are listed in the table. In the example of FIG. 30A-30D, the sub-block program order is SB0, SB1, SB2, SB3. In the following example, the sub-block program order is SB1, SB0, SB2, SB3.

FIG. 31A depicts an example configuration of a table consistent with FIGS. 18D and 25 in an initial configuration. The first row of the table indicates SB1 is the current sub-block to program, that SB1 is to be programmed with a WL program direction toward the source side of the block, and SB0 is the next sub-block to program. The second row indicates SB0 is to be programmed with a WL program direction toward the source side of the block, and SB2 is the next sub-block to program. The third row indicates SB2 is to be programmed with a WL program direction toward the drain side of the block, and SB3 is the next sub-block to program. The fourth row indicates SB3 is to be programmed with a WL program direction toward the drain side of the block, and there is not a next sub-block to program.

FIG. 31B depicts an example configuration of the table of FIG. 31A after SB1 is programmed. The first row of the table indicates SB0 is to be programmed with a WL program direction toward the source side of the block, and SB2 is the next sub-block to program. The second row indicates SB2 is to be programmed with a WL program direction toward the drain side of the block, and SB3 is the next sub-block to program. The third row indicates SB3 is to be programmed with a WL program direction toward the drain side of the block, and there is not a next sub-block to program.

FIG. 31C depicts an example configuration of the table of FIG. 31B after SB0 is programmed. The first row of the table indicates SB2 is to be programmed with a WL program direction toward the drain side of the block, and SB3 is the next sub-block to program. The second row indicates SB3 is to be programmed with a WL program direction toward the drain side of the block, and there is not a next sub-block to program.

FIG. 31D depicts an example configuration of the table of FIG. 31C after SB2 is programmed. The row of the table indicates SB3 is to be programmed with a WL program direction toward the drain side of the block, and there is not a next sub-block to program.

In an example implementation consistent with FIG. 30A-31D, a control circuit is configured to determine a program or erase status of at least two unselected sub-blocks of a plurality of sub-blocks of a block, and the word line program order for a selected sub-block of the block is based on the program or erase status of the at least two unselected sub-blocks.

Multiple copies of the example tables depicted above can be stored in the memory device to ensure that the data is available for selecting a sub-block to program. In case the tables are not available for some reason, or not used, the process of FIG. 18E can be followed instead.

Accordingly, it can be seen that in one implementation, an apparatus comprises: a control circuit configured to connect to a block, the block comprising memory cells connected to word lines in a plurality of sub-blocks, each sub-block is in a respective tier of a plurality of tiers of the block. The control circuit configured to: select a sub-block of the plurality of sub-blocks for a program operation; determine a program or erase status of an unselected sub-block of the plurality of sub-blocks; and program the selected sub-block in a word line program order based on the program or erase status of the unselected sub-block.

In another implementation, a method comprises: in response to a program command for a selected sub-block of a block, determining a program or erase status of unselected sub-blocks of the block, each sub-block of the block comprising memory cells connected to word lines in a respective tier of a plurality of tiers of the block, the memory cells are arranged in NAND strings and the block comprises a drain side and a source side; determining whether to pre-charge channels of the NAND strings from the drain side or the source side of the block based on the program or erase status of the unselected sub-blocks; applying a plurality of program pulses to a selected word line of the selected sub-block in a program operation; and pre-charging the channels of the NAND strings from the drain side or the source side of the block before each program pulse based on the program or erase status of the unselected sub-blocks.

In another implementation, an apparatus comprises: a block comprising memory cells connected to word lines in a plurality of sub-blocks, each sub-block is in a respective tier of a plurality of tiers of the block, the block comprises a drain side and a source side, the plurality of sub-blocks comprise a drain-side sub-block adjacent to the drain side of the block and a source-side sub-block adjacent to the source side of the block, and the memory cells are arranged in NAND strings which extend from the drain side to the source side of the block; and a control circuit. The control circuit: to erase memory cells in the drain-side sub-block, is configured to charge up channels of the NAND strings from the drain side of the block while inhibiting erase of memory cells in the source-side sub-block; to erase memory cells in the source-side sub-block, is configured to charge up the channels of the NAND strings from the source side of the block while inhibiting erase of memory cells in the drain-side sub-block; to reserve the source-side sub-block for programming in an N1 bit per cell mode; and to reserve the drain-side sub-block for programming in an N2>N1 bit per cell mode.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. An apparatus, comprising;
a control circuit configured to connect to a block, the block comprising memory cells connected to word lines in a plurality of sub-blocks, each sub-block is in a respective tier of a plurality of tiers of the block, each sub-block comprises alternating conductive and dielectric layers, adjacent sub-blocks of the plurality of sub-blocks are separated by a junction and a height of the junction is greater than at least 1.5 times a height of each of the dielectric layers, the control circuit configured to:
select a sub-block of the plurality of sub-blocks for a program operation;
determine a program or erase status of an unselected sub-block of the plurality of sub-blocks; and
program the selected sub-block in a word line program order based on the program or erase status of the unselected sub-block.

2. The apparatus of claim 1, wherein:
to determine the program or erase status of the unselected sub-block, the control circuit is configured to access a data structure indicating a program or erase status of each sub-block of the plurality of sub-blocks.

3. The apparatus of claim 2, wherein:
the data structure indicates an order in which the sub-blocks are to be programmed.

4. The apparatus of claim 1, wherein:
the unselected sub-block is an edge sub-block of the plurality of sub-blocks; and
to determine the program or erase status of the unselected sub-block, the control circuit is configured to read memory cells connected to an edge word line of the unselected sub-block.

5. The apparatus of claim 4, wherein:
the memory cells of the block are arranged in a plurality of NAND string groups; and
the memory cells which are read to determine the program or erase status of the unselected sub-block are in a single NAND string group of the plurality of NAND string groups.

6. The apparatus of claim 1, wherein:
the unselected sub-block is an interior sub-block of the plurality of sub-blocks; and
to determine the program or erase status of the unselected sub-block, the control circuit is configured to read memory cells connected to edge word lines at opposing sides of the unselected sub-block.

7. The apparatus of claim 1, wherein:
the control circuit is configured to determine a program or erase status of at least two unselected sub-blocks of the plurality of sub-blocks; and
the word line program order is based on the program or erase status of the at least two unselected sub-blocks of the plurality of sub-blocks.

8. The apparatus of claim 1, wherein:
the control circuit is configured to reserve one sub-block of the plurality of sub-blocks for an N1 bit per cell mode and to reserve another sub-block of the plurality of sub-blocks for an N2>N1 bit per cell mode.

9. The apparatus of claim 1, wherein:
the memory cells are arranged in NAND strings on a substrate;
the plurality of sub-blocks comprise a sub-block adjacent to the substrate and a sub-block non-adjacent to the substrate; and
the control circuit is configured to:
  erase the sub-block which is adjacent to the substrate by charging up the substrate;
  erase the sub-block which is non-adjacent to the substrate by generating holes at drain-ends of the NAND strings;
  program the selected sub-block in an N1 bit per cell mode when the selected sub-block is the sub-block which is adjacent to the substrate; and
  program the selected sub-block in an N2>N1 bit per cell mode when the selected sub-block is the sub-block which is non-adjacent to the substrate.

10. The apparatus of claim 1, wherein:
the block comprises a drain side and a source side;
the memory cells are arranged in NAND strings which extend from the drain side to the source side of the block;
each NAND string comprises a channel; and
in the programming of the selected sub-block, the control circuit is configured to pre-charge channels of the NAND strings from the drain side or the source side of the block before applying a program pulse to a selected word line of the block, based on the program or erase status of the unselected sub-block.

11. A method, comprising:
in response to a program command for a selected sub-block of a block, determining a program or erase status of unselected sub-blocks of the block, each sub-block of the block comprising memory cells connected to word lines in a respective tier of a plurality of tiers of the block, the memory cells are arranged in NAND strings and the block comprises a drain side and a source side;
determining whether to pre-charge channels of the NAND strings from the drain side or the source side of the block based on the program or erase status of the unselected sub-blocks;
applying a plurality of program pulses to a selected word line of the selected sub-block in a program operation; and
pre-charging the channels of the NAND strings from the drain side or the source side of the block before each program pulse based on the program or erase status of the unselected sub-blocks.

12. The method of claim 11, further comprising:
programming the selected sub-block in a word line program order based on the program or erase status of the unselected sub-blocks.

13. The method of claim 11, wherein:
the determining the program or erase status of the unselected sub-blocks comprises accessing a data structure indicating a program or erase status of each sub-block of the plurality of sub-blocks.

14. The method of claim 11, wherein:
the determining the program or erase status of the unselected sub-blocks comprises reading memory cells connected to an edge word line of an edge unselected sub-block and reading memory cells connected to edge word lines at opposing sides of an interior unselected sub-block.

15. A storage device, comprising:
a block comprising a plurality of sub-blocks, each sub-block of the block comprising memory cells connected to word lines in a respective tier of a plurality of tiers of the block, the memory cells are arranged in NAND strings and the block comprises a drain side and a source side;
a control circuit connected to the block, the control circuit configured to:
  in response to a program command for a selected sub-block of the block, determine a program or erase status of unselected sub-blocks of the block, the memory cells are arranged in NAND strings and the block comprises a drain side and a source side;
  determine whether to pre-charge channels of the NAND strings from the drain side or the source side of the block based on the program or erase status of the unselected sub-blocks;
  apply a plurality of program pulses to a selected word line of the selected sub-block in a program operation; and
  pre-charge the channels of the NAND strings from the drain side or the source side of the block before each program pulse based on the program or erase status of the unselected sub-blocks.

16. The apparatus of claim 15, further comprising:
a data structure indicating a program or erase status of each sub-block of the plurality of sub-blocks, the control circuit configured to access the data structure to determine the program or erase status of the unselected sub-block.

17. The apparatus of claim 15, wherein:
the block includes edge sub-blocks and interior sub-blocks, the unselected sub-block is an edge sub-block; and
the control circuit is configured to read memory cells connected to an edge word line of the unselected sub-block to determine the program or erase status of the unselected sub-block.

18. The apparatus of claim 15, wherein:
the memory cells of the block are arranged in a plurality of NAND string groups; and
the memory cells which are read to determine the program or erase status of the unselected sub-block are in a single NAND string group of the plurality of NAND string groups.

19. The apparatus of claim 15, wherein:
each sub-block comprises alternating conductive and dielectric layers;
adjacent sub-blocks of the plurality of sub-blocks are separated by a junction; and,
a height of the junction is greater than at least 1.5 times a height of each of the dielectric layers.

\* \* \* \* \*